(12) United States Patent
Chen et al.

(10) Patent No.: US 12,237,400 B2
(45) Date of Patent: Feb. 25, 2025

(54) METHOD OF FORMING SEMICONDUCTOR DEVICE

(71) Applicant: TAIWAN SEMICONDUCTOR MANUFACTURING COMPANY, LTD., Hsinchu (TW)

(72) Inventors: Chieh-Wei Chen, Hsinchu (TW); Jian-Jou Lian, Hsinchu (TW); Tzu-Ang Chiang, Hsinchu (TW); Po-Yuan Wang, Hsinchu (TW); Yu-Shih Wang, Hsinchu (TW); Chun-Neng Lin, Hsinchu (TW); Ming-Hsi Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 407 days.

(21) Appl. No.: 17/714,630

(22) Filed: Apr. 6, 2022

(65) Prior Publication Data
US 2023/0327002 A1 Oct. 12, 2023

(51) Int. Cl.
*H01L 29/66* (2006.01)
*H01L 29/40* (2006.01)
H01L 21/8234 (2006.01)
H01L 29/423 (2006.01)

(52) U.S. Cl.
CPC ...... *H01L 29/66795* (2013.01); *H01L 29/401* (2013.01); *H01L 29/66545* (2013.01); *H01L 21/823431* (2013.01); *H01L 21/823437* (2013.01); *H01L 29/4236* (2013.01)

(58) Field of Classification Search
CPC ............. H01L 29/66545; H01L 29/401; H01L 29/4958; H01L 29/66795; H01L 29/7848; H01L 29/78645
See application file for complete search history.

(56) References Cited

U.S. PATENT DOCUMENTS

| | | | |
|---|---|---|---|
| 8,507,979 B1 * | 8/2013 | Huang | H01L 29/517 |
| | | | 257/334 |
| 2016/0351675 A1 * | 12/2016 | Patil | H01L 29/66545 |
| 2020/0119018 A1 * | 4/2020 | Chang | H01L 29/66545 |
| 2021/0050267 A1 * | 2/2021 | Li | H01L 21/823418 |
| 2021/0057282 A1 * | 2/2021 | Chen | H01L 21/31144 |
| 2021/0098301 A1 * | 4/2021 | Wu | H01L 21/32133 |

\* cited by examiner

*Primary Examiner* — Wasiul Haider
(74) *Attorney, Agent, or Firm* — Birch, Stewart, Kolasch & Birch, LLP

(57) ABSTRACT

A method of forming a semiconductor device includes: forming a semiconductor structure having source/drain regions, a fin disposed between the source/drain regions, and a dummy gate disposed on the fin and surrounded by a spacer; removing the dummy gate to form a gate trench which is defined by a trench-defining wall; forming a gate dielectric layer on the trench-defining wall; forming a work function structure on the gate dielectric layer; forming a resist layer to fill the gate trench; removing a top portion of the resist layer; removing the work function structure exposed from the resist layer using a wet chemical etchant; removing the resist layer; and forming a conductive gate in the gate trench.

20 Claims, 31 Drawing Sheets

METHOD OF FORMING SEMICONDUCTOR DEVICE

BACKGROUND

With the continuous development of semiconductor technology, device density has increased and the geometry size has decreased. There are many manufacturing techniques being implemented in order to create new generations of devices. For example, gate replacement processes, which involve replacing dummy gate electrodes (e.g., polysilicon electrodes) with metal gate electrodes, are widely adopted for improving device performance. The work function values of the metal gate electrodes can be tailored by forming different work function materials with various thicknesses and heights, such that the threshold voltages of different semiconductor devices are obtained. Therefore, it is desired in the art to provide a method of forming semiconductor devices with precisely tailored work function material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
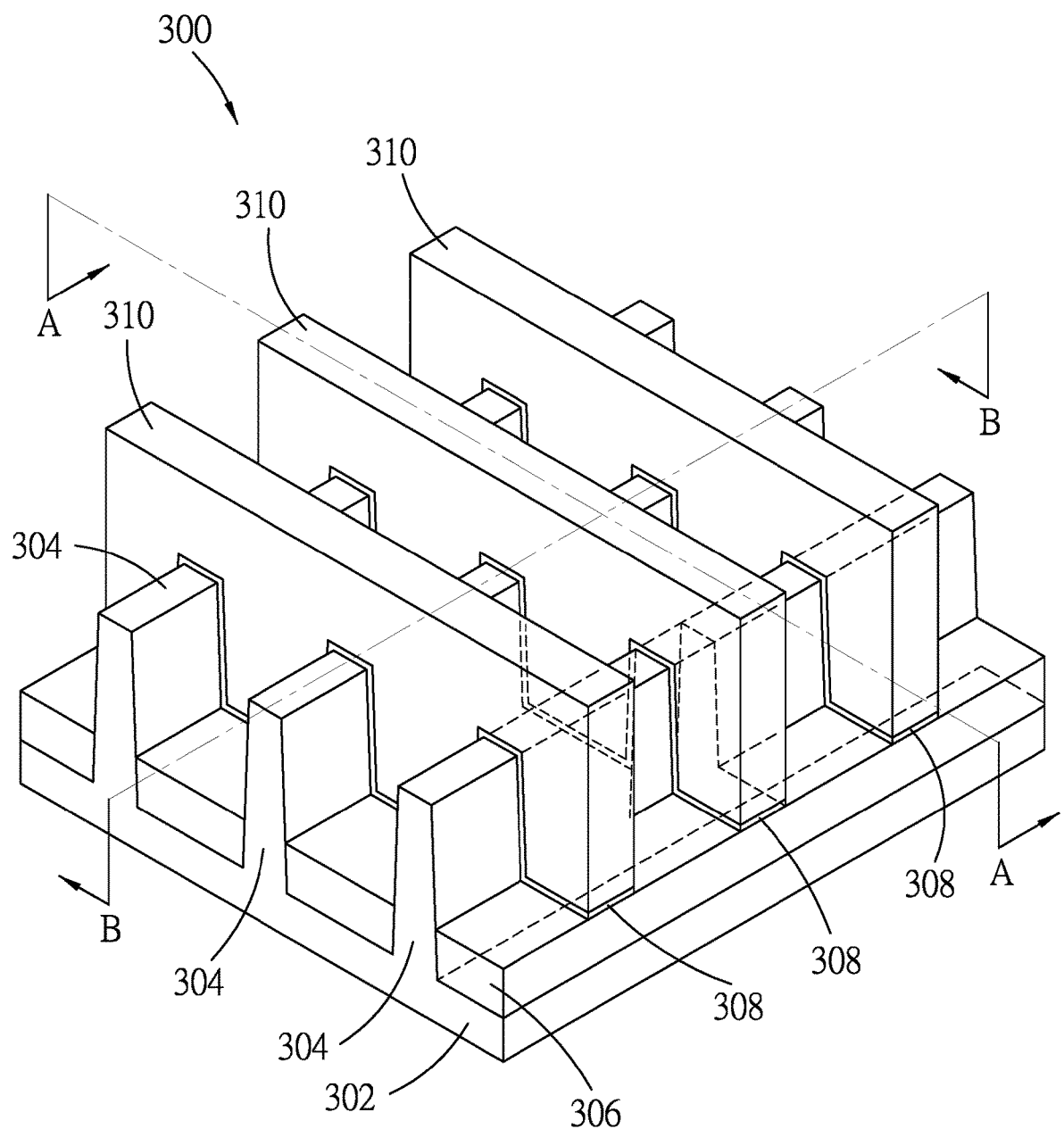
FIG. 1 is a schematic and perspective view of a fin field-effect transistor (FinFET) device in accordance with some embodiments of this disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments of the present disclosure, FIG. 1 is a schematic perspective view of a semiconductor structure 300, which may be a part of a fin field-effect transistor (FinFET) device or other suitable devices. In some embodiments, the semiconductor structure 300 includes a semiconductor substrate 302, a plurality of fins 304 protruding from the semiconductor substrate 302, an isolation structure 306 formed on the semiconductor substrate 302 and surrounding the fins 304. The semiconductor structure 300 further includes a plurality of dummy gate dielectric layers 308 that are disposed on the isolation structure 306 and the fins 304, and a plurality of dummy gates 310 respectively disposed on the dummy gate dielectric layers 308. FIG. 1 also schematically shows line A-A, where cross sections of the semiconductor structure 300 will be taken during various process steps of forming the semiconductor structure 300, which will be described hereinafter. Line B-B is also schematically shown in FIG. 1, where cross sections of the semiconductor structure 300 will be taken during various process steps of forming the semiconductor structure 300, which will be described hereinafter.

Figure 2:
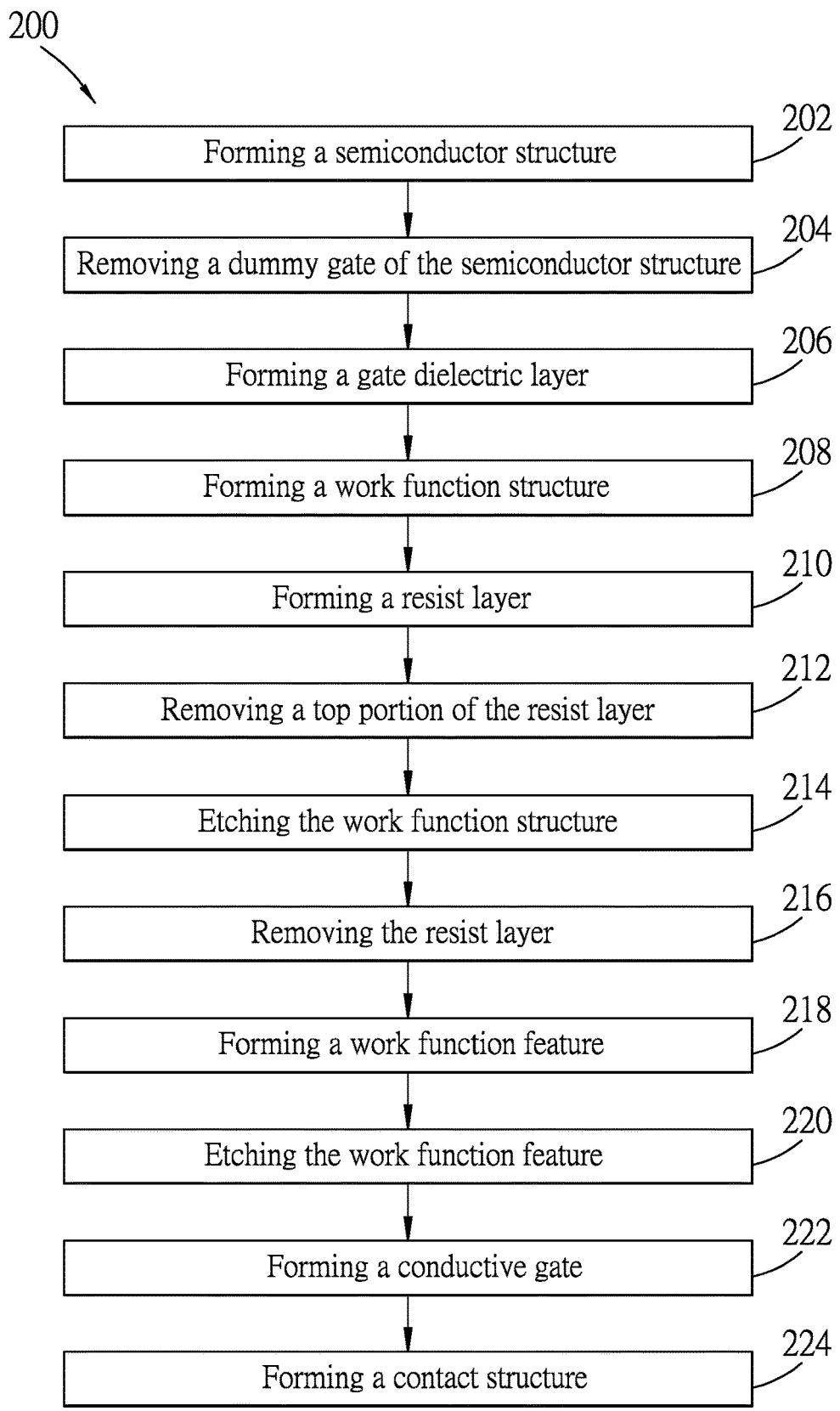
FIG. 2 is a flow chart of a method of forming a semiconductor device in accordance with some embodiments of this disclosure.

In accordance with some embodiments of the present disclosure, a method 200 of forming a semiconductor device is illustrated by the process flow in FIG. 2.

Figure 3:
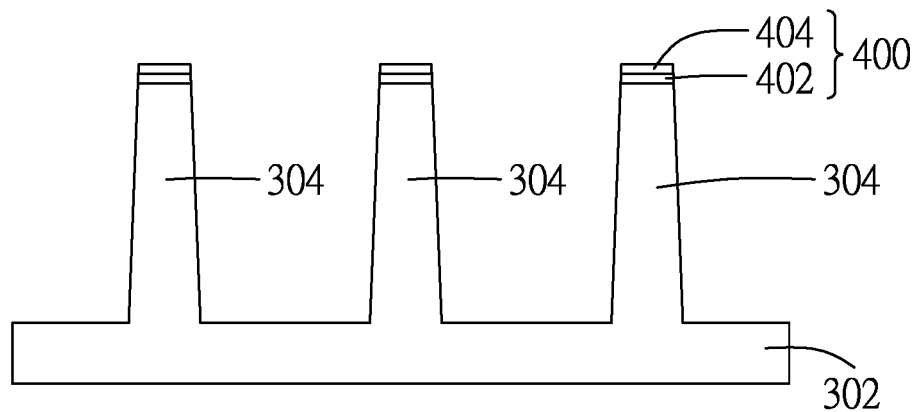
FIGS. 3 to 22 are schematic views showing intermediate steps of a method of forming a semiconductor device in accordance with some embodiments of this disclosure.
Figure 4:
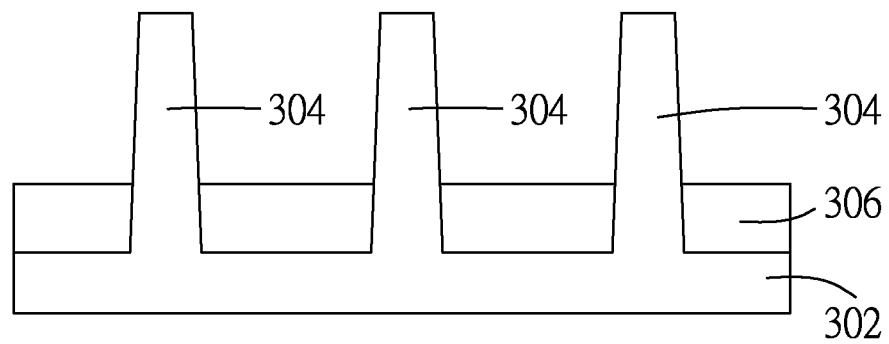
Figure 5:
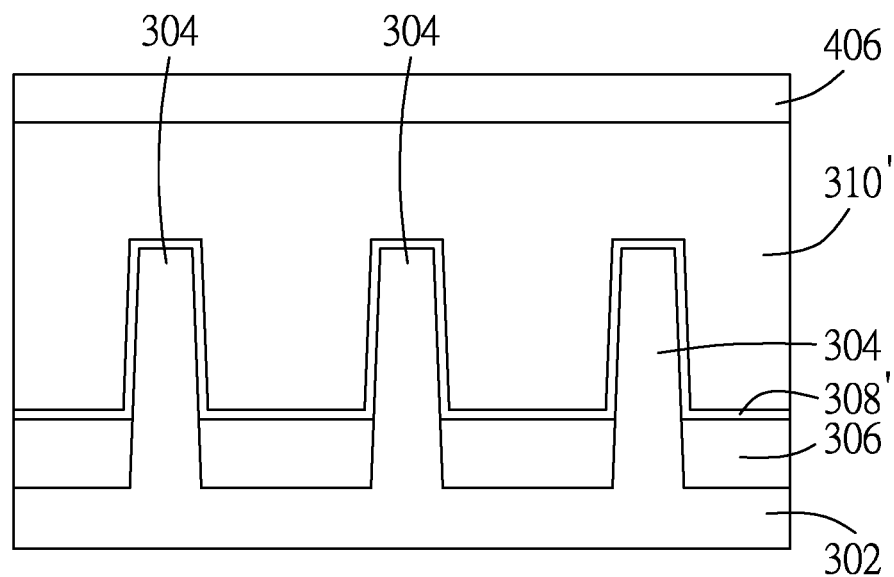

Referring to FIG. 2, in step 202 of the method 200, the semiconductor structure 300 is formed. Intermediate steps of forming the semiconductor structure 300 are illustrated in FIGS. 3 to 5. Referring to FIG. 3, in some embodiments, the semiconductor substrate 302 is provided, where the semiconductor substrate 302 may be a bulk semiconductor substrate or a semiconductor-on-insulator (SOI) substrate, which may be doped (e.g., doped with p-type or n-type dopants) or undoped. In some embodiments, the SOI substrate may include a semiconductor layer formed on an insulating layer, where the insulating layer may be a buried oxide (BOX) layer, and the insulating layer may be formed on a substrate, where the substrate may be made of silicon, glass, or other suitable materials. In some embodiments, the semiconductor substrate 302 may be made of an elemental semiconductor, a compound semiconductor, other suitable materials, or any combination thereof. The elemental semiconductor may contain a single species of atoms, such as Si, Ge or other suitable materials. The compound semiconductor may be composed of at least two elements, such as GaAs, SiC, SiGe, GaP, InSb, InAs, InP, GaAsP, GaInP, GaInAs, AlGaAs, AlInAs, GaInAsP, other suitable materials, or any combination thereof.

Afterwards, the semiconductor substrate 302 is etched, using reactive ion etch (RIE), neutral beam etch (NBE), or other suitable techniques, to form the fins 304. In some embodiments, a mask 400, which includes a pad oxide layer 402 and a pad nitride layer 404 is used when etching the substrate 302. The mask 400 is patterned to a desired shape, followed by etching the semiconductor substrate 302 using the mask 400 as an etch mask to form the fins 304. In some embodiments, the pad oxide layer 402 may be made from silicon oxide by thermal oxidation or other suitable techniques. In some embodiments, the pad nitride layer 404 may be made of silicon nitride, silicon carbonitride, silicon oxynitride, other suitable materials, or any combination thereof. In some embodiments, the pad nitride layer 404 may be made by chemical vapor deposition (CVD) (e.g., low-pressure CVD (LPCVD), plasma enhanced CVD (PECVD), etc.), other suitable techniques, or any combination thereof.

Referring to FIG. 4, after forming the fins 304, the mask 400 is removed, followed by forming the isolation structure 306 on the semiconductor substrate 302 and surrounding the fins 304. In some embodiments, the isolation structure 306 may be made of an oxide-based material, a nitride-based material, other suitable materials, or any combination thereof, and may be made by CVD (e.g., flowable CVD (FCVD), high density plasma CVD (HDP CVD), etc.), other suitable techniques, or any combination thereof.

Referring to FIG. 5, after forming the isolation structure 306, a dummy gate dielectric structure 308' and a dummy gate structure 310' are formed on the isolation structure 306 and the fins 304. In some embodiments, the dummy gate dielectric structure 308' may be made of silicon oxide, silicon nitride, other suitable materials, or any combination thereof. In some embodiments, the dummy gate structure 310' may be made of polysilicon, other suitable materials, or any combination thereof. Afterwards, a mask layer 406, which may be made of silicon nitride or other suitable materials, is formed on the dummy gate structure 310'. The mask layer 406 may be etched into a desired shape, followed by etching the dummy gate structure 310' and the dummy gate dielectric structure 308' using the etched mask layer 406 as an etch mask to form the dummy gate dielectric layers 308 and the dummy gates 310 (see FIG. 1), followed by removing the etched mask layer 406, thereby obtaining the semiconductor structure 300 as shown in FIG. 1.

Figure 6:
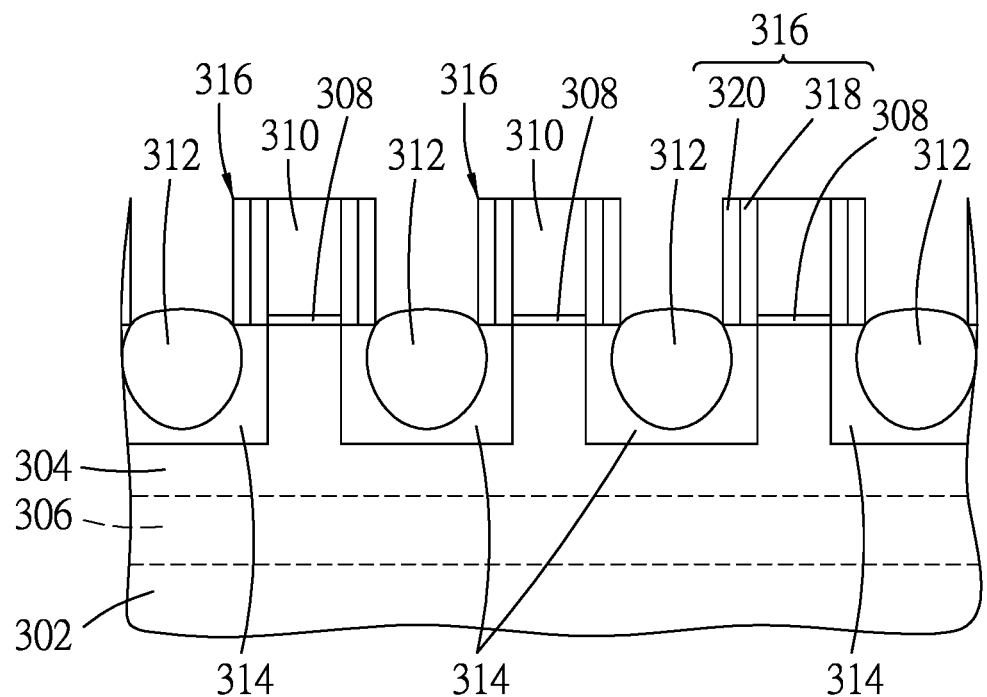

FIG. 6 is a schematic section view taken from line B-B of FIG. 1. FIG. 6 schematically shows that, after the etched mask layer 406 (see FIG. 5) is removed, a plurality of doped regions 314 are formed in the fin 304 and are spaced apart from each other. In some embodiments, the doped regions 314 may be formed by plasma doping or other suitable techniques, where p-type or n-type dopants are introduced into the fin 304 to form the doped regions 314.

FIG. 6 also shows that, after forming the doped regions 314, a plurality of spacers 316 are formed to respectively surround the dummy gate dielectric layers 308 and the dummy gates 310. In some embodiments, each of the spacers 316 includes a first spacer portion 318 that is connected to opposite side walls of the respective dummy gate dielectric layer 308 and the respective dummy gate 310, and a second spacer portion 320 that is connected to the first spacer portion 318. In some embodiments, the first spacer portion 318 of each of the spacers 316 may be made of silicon oxide, silicon oxycarbonitride, other suitable materials, or any combination thereof, and may be made by CVD, thermal oxidation, other suitable techniques, or any combination thereof. The second spacer portion 320 of each of the spacers 316 may be made of silicon nitride, silicon oxynitride, silicon carbonitride, other suitable materials, or any combination thereof, and may be made by CVD, thermal oxidation, other suitable techniques, or any combination thereof.

FIG. 6 also shows that, after forming the spacers 316, a plurality of source/drain regions 312 are formed in the fin 304 by metal-organic CVD (MOCVD), liquid phase epitaxy (LPE), vapor phase epitaxy (VPE), molecular beam epitaxy (MBE), selective epitaxy growth (SEG), other suitable techniques, or any combination thereof. In some embodiments, when the semiconductor structure 300 (see FIG. 1) is an n-type FinFET, the source/drain regions 312 may be made of silicon carbide (SiC), silicon phosphorous (SiP), phosphorous-doped silicon carbon (SiCP), other suitable materials, or any combination thereof. In some embodiments, when the semiconductor structure 300 is a p-type FinFET, the source/drain regions 312 may be made of silicon germanium (SiGe), other suitable materials, or any combination thereof, and may be doped with p-type impurities.

Figure 7:
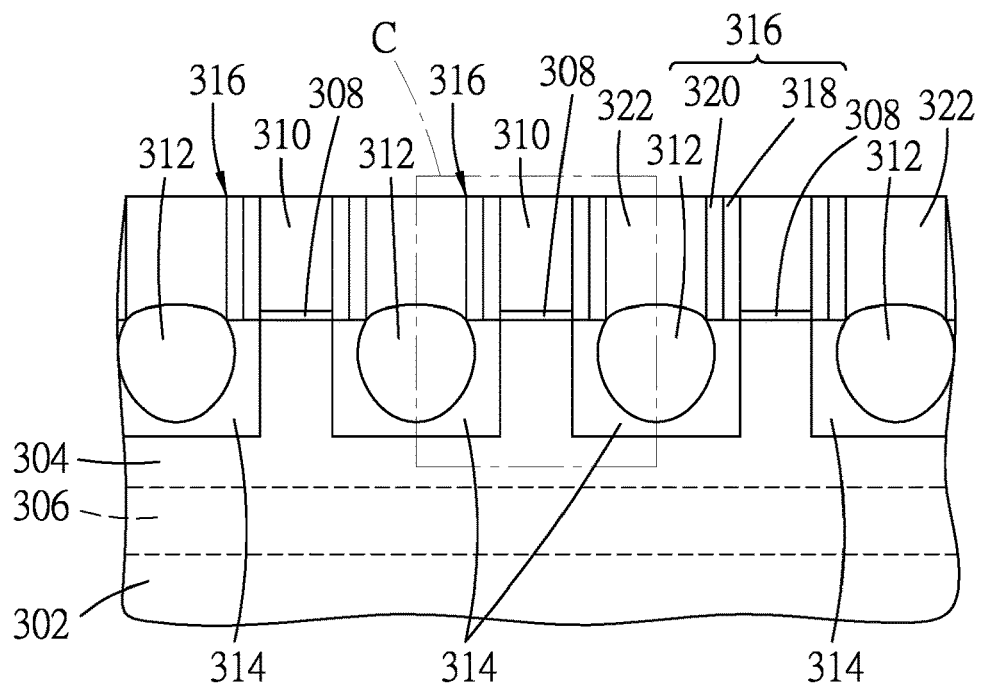

FIG. 7 shows that, after forming the source/drain regions 312, a plurality of interlayer dielectric (ILD) structures 322 are formed to respectively cover the source/drain regions 312. In some embodiments, the ILD structures 322 may be made of silicon oxide, undoped silicate glass (USG), borosilicate glass (BSG), phosphosilicate glass (PSG), boron-doped phosphosilicate glass (BPSG), other suitable materials, or any combination thereof, and may be made by CVD (e.g., PECVD, FCVD, etc.), other suitable techniques, or any combination thereof.

Referring to FIG. 2, in step 204 of the method 200, the dummy gates 310 (see FIG. 7) are removed to form a plurality of gate trenches 324. For simplicity, FIG. 8, in which only one gate trench 324 is shown, is an enlarged view taken from block (C) of FIG. 7 for illustrating the following process steps. In some embodiments, as in step 204 illustrated by FIG. 8, the dummy gate dielectric layer 308 and the dummy gate 310 (see FIG. 7) are removed to form the gate trench 324 which is defined by a trench-defining wall 326. In some embodiments, the gate trench 324 may have a height (L) ranging from about 75 nm to about 90 nm, but other ranges of values are also within the scope of this disclosure. In some embodiments, if the height (L) of the gate trench 324 is too small, such as smaller than about 75 nm, there might not be enough space for depositing subsequent work function materials and contact structures. In some embodiments, if the height (L) of the gate trench 324 is too large, such as greater than about 90 nm, the aspect ratio of the gate trench 324 may be too large, making it more difficult to deposit work function materials in the gate trenches 324. In some embodiments, the gate trench 324 may have a width (M) ranging from about 9 nm to about 150 nm, but other ranges of values are also within the scope of this disclosure. Examples of the width (M) of the gate trench 324 may range from about 9 nm to about 12 nm, from about 12 nm to about 30 nm, from about 30 nm to about 55 nm, from about 55 nm to about 150 nm, or other suitable ranges. In some embodiments, if the width (M) of the gate trench 324 is too small, such as smaller than about 9 nm, it may be difficult to properly deposit the work function materials in the gate trench 324. In some embodiments, if the width (M) of the gate trench 324 is too large, such as larger than about 150 nm, the resulting device may occupy too much space.

Referring to FIG. 2, in step 206 of the method 200, a gate dielectric layer 328 (see FIG. 9) is formed. In some embodiments, the gate dielectric layer 328 may be conformally formed above the ILD structures 322 and the spacer 316 and on the trench-defining wall 326 (see FIG. 8) (i.e., in the gate trench 324). In some embodiments, the gate dielectric layer 328 may be made of silicon oxide, silicon nitride, a high-k dielectric material, other suitable materials, or any combination thereof. In some embodiments, the high-k dielectric material may be a metal oxide or a silicate of Hf, Al, Ga, Ta, Gd, Y, Zr, La, Mg, Ba, Ti, Pb, other suitable materials, or any combination thereof. In some embodiments, the gate dielectric layer 328 may be formed to have any suitable thickness, and may be formed by atomic layer deposition (ALD), PECVD, other suitable techniques, or any combination thereof.

Figure 9:
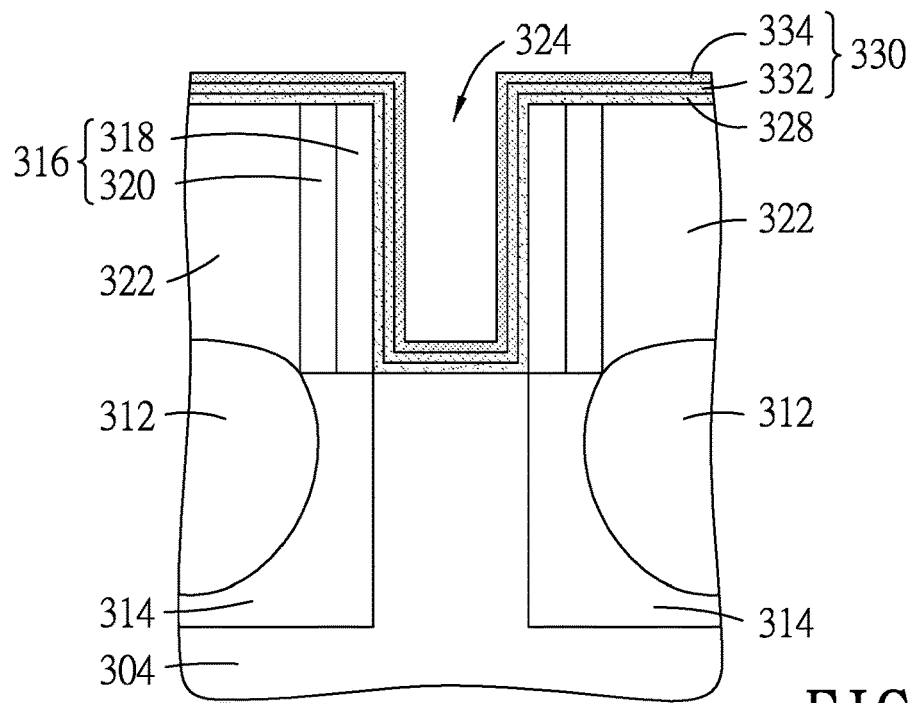

Referring to FIG. 2, in step 208 of the method 200, a work function structure 330 (see FIG. 9) is formed. Referring to FIG. 9, in some embodiments, the work function structure 330 may be conformally formed on the gate dielectric layer 328 by ALD, CVD, physical vapor deposition (PVD), other suitable techniques, or any combination thereof. In some embodiments, the work function structure 330 may include a first work function layer 332 and a second work function layer 334, where each of the first and second work function layers 332, 334 is made of p-type work function material or n-type work function material, chosen according to practical requirements. The p-type work function material may be WN, Al, Mo, Ru, TiN, TaN, $MoSi_2$, $ZrSi_2$, $TaSi_2$, $NiSi_2$, other suitable materials, or any combination thereof. The n-type work function material may be Ti, Ag, Mn, Zr, TaAl, TiAlN, TaAlC, TaC, TaCN, TaSiN, other suitable materials, or any combination thereof. In some embodiments, the first and second work function layers 332, 334 may be made of different p-type work function materials. For example, the first work function layer 332 may be made of WN, and the second work function layer 334 may be made of TiN. In some embodiments, each of the first and second work function layers 332, 334 may have a thickness ranging from about 8 Å to about 30 Å, but other ranges of values are also within the scope of this disclosure. Examples of the thickness of each of the first and second work function layers 332, 334 may range from about 8 Å to about 15 Å, from about 15 Å to about 20 Å, from about 20 Å to about 30 Å, and may be adjusted according to practical requirements. In some embodiments, if the thickness of the first work function layer 332 or the second work function layer 334 is too small, such as smaller than about 8 Å, a desirable work function value may not be obtained. In some embodiments, if the thickness of the first work function layer 332 or the second work function layer 334 is too large, such as larger than about 30 Å, the work function structure 330 may occupy too much space of the gate trench 324. The work function value of the resulting transistor is influenced by the composition of the work function structure 330. Therefore, different metals with different work function values are chosen to adjust the work function value and the threshold voltage of the resulting device. In some embodiments, the work function structure 330 may be etched to further adjust the work function values, which will be described hereinafter.

Figure 10:
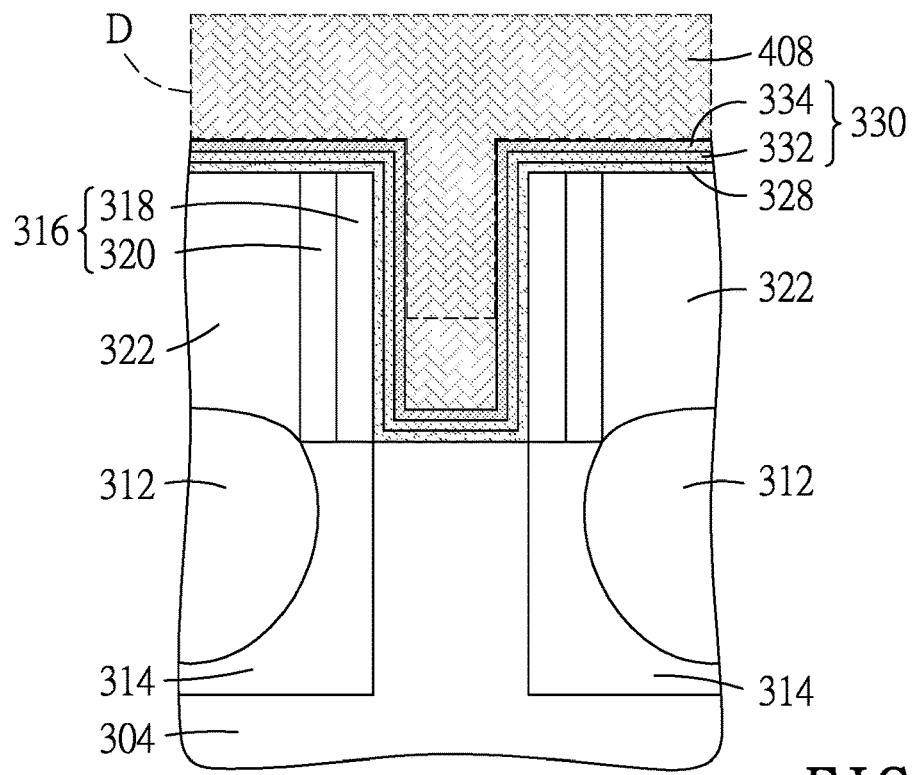

Referring to FIG. 2, in step 210 of the method 200, a resist layer 408 (see FIG. 10) is formed. Referring to FIG. 10, in some embodiments, the resist layer 408 may be formed on the second work function layer 334 of the work function structure 330 to fill the gate trench 324 (see FIG. 9). In some embodiments, the resist layer 408 may be made of nitrogen-based material, a carbon-based material, or a polymer-based material. In some embodiments, the resist layer 408 may be an anti-reflective coating (ARC) layer made of silicon oxide, silicon nitride, silicon oxynitride, other suitable materials, or any combination thereof. In some embodiments, the resist layer 408 may be made of an organic material, a compound material including SiO, $SiO_2$, $MgF_2$, $Cr_2O_3$, ITO, $Si_3N_4$, $TaO_5$, $Al_2O_3$, TiN, ZrO, etc., a metal-based material including In, Al, Ag, Au, etc.; other suitable materials, or any combination thereof. In some embodiments, the resist layer 408 may be formed by ALD, CVD (e.g., PECVD, etc.), spin coating, other suitable techniques, or any combination thereof. In some embodiments, the resist layer 408 may be a multilayer including a bottom anti-reflective coating (BARC), a middle layer (ML), and a photoresist layer (PR).

Referring to FIG. 2, in step 212 of the method 200, a top portion (D) of the resist layer 408 (see FIG. 10) is removed.

Figure 11:
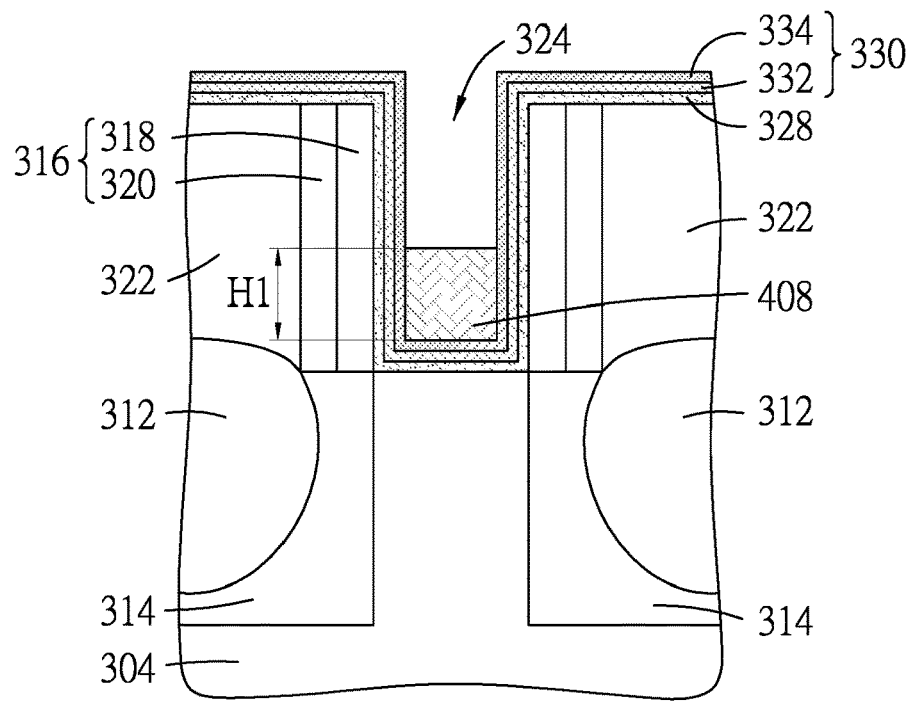

Referring to FIGS. 10 and 11, the top portion (D) of the resist layer 408 may be removed by etching, such as wet etching, plasma dry etching, other suitable techniques, or any combination thereof. In some embodiments, plasma dry etching may use an etchant including C, H, O, F, Br, Cl, other suitable etchants, or any combination thereof. In some embodiments, the top portion (D) of the resist layer 408 is removed to lower the resist layer 408 in the gate trench 324 to a height (H1), which may be determined according to practical requirements. In some embodiments, the height (H1) of the resist layer 408 may range from about 15 nm to about 25 nm, but other ranges of values are also within the scope of this disclosure, and the height (H1) of the resist layer 408 may be adjusted to a proper value according to practical requirements.

Figure 12:
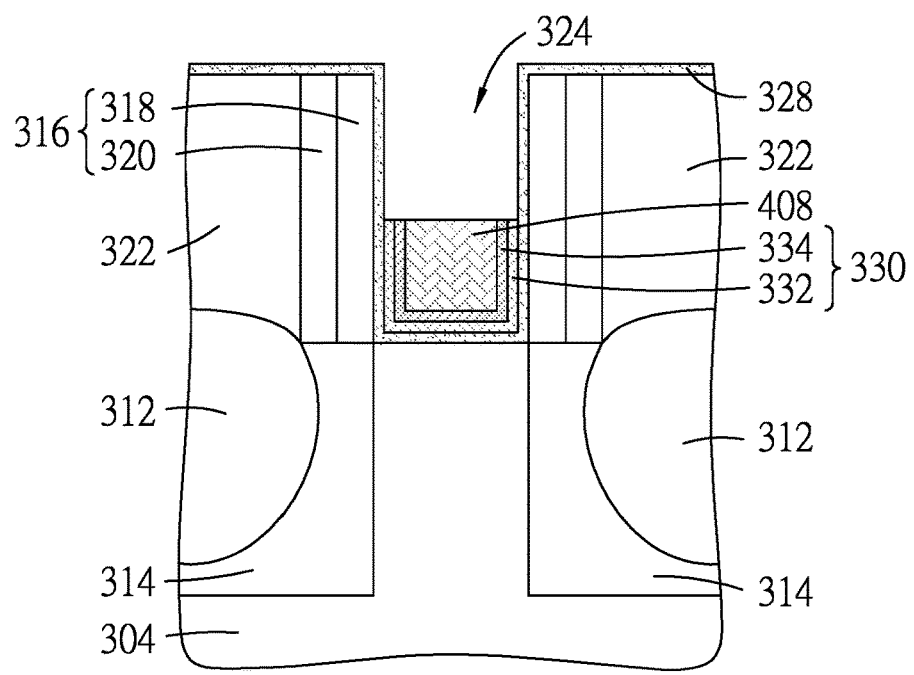

Referring to FIG. 2, a step 214 of the method 200, the work function structure 330 (see FIG. 12) is etched. Referring to FIG. 12, in some embodiments, the first and second work function layers 332, 334 of the work function structure 330 are selectively etched using the resist layer 408 as a mask. In some embodiments, a vertical height of the etched work function structure 330 may range from about 10 nm to about 25 nm (e.g., about 10 nm, about 15 nm, about 20 nm, about 25 nm, etc.), but other ranges of values are also within the scope of this disclosure. Examples of the vertical height of the work function structure 330 may range from about 10 nm to about 12 nm, from about 12 nm to about 14 nm, from about 14 nm to about 20 nm, and may be adjusted according to practical requirements. If the vertical height of the etched work function structure 330 is too large or too small, such as greater than about 20 nm or smaller than about 10 nm, the resulting work function value may not be desirable. The etching process may be carried out using a wet chemical etchant, such that the first and second work function layers 332, 334 are lowered to be no higher than the resist layer 408 with top surfaces of the first and second work function layers 332, 334 substantially level with each other, and the gate dielectric layer 328 is substantially unetched. In some embodiments, the etched first and second work function layers 332, 334 may be substantially level with the resist layer 408; and, in other embodiments, the etched first and second work function layers 332, 334 may be slightly lower than the resist layer 408 (i.e., top surfaces of the etched first and second work function layers 332, 334 may be slightly lower than a top surface of the resist layer 408). In some embodiments, the wet chemical etchant may include a mixture of an acid (e.g., hydrochloric acid or other suitable kinds of acid) and an oxidizer. In some embodiments, the oxidizer may include $H_2O_2$, ozone, other suitable materials, or any combination thereof. In some embodiments, a volume percentage of the acid (e.g., hydrochloric acid) based on the wet chemical etchant may range from about 0.01% to about 1% (other ranges of values are also within the scope of this disclosure), and a volume percentage of the oxidizer based on the wet chemical etchant may range from about 0.1% to about 10% (other range of values are also within the scope of this disclosure). If the concentration of the acid is too low, such as less than about 0.01%, the wet chemical etchant may not be able to complete the etching process due to its low concentration. If the concentration of the acid is too high, such as greater than about 1%, the first and second work function layers 332, 334 may be over-etched, rendering the first and second work function layers 332, 334 to be considerably lower than the resist layer 408. If the concentration of the oxidizer is too low, such as less than about 0.1%, the wet chemical etchant may not be able to complete the etching process due to insufficient oxidizer. If the concentration of the oxidizer is too high, such as greater than about 10%, the first and second work function layers 332, 334 may be over-etched, rendering the first and second work function layers 332, 334 to be considerably lower than the resist layer 408. In some embodiments, the process of etching the first and second work function layers 332, 334 may be carried out under temperatures ranging from about 20° C. to about 60° C., but other ranges of values are also within the scope of this disclosure. If the temperature of the etching process is too low, such as lower than about 20° C., the wet chemical etchant may not be able to complete the etching process. If the temperature of the etching process is too high, such as higher than about 60° C., the first and second work function layers 332, 334 may be over-etched, rendering the first and second work function layers 332, 334 to be considerably lower than the resist layer 408. In some embodiments, during the process of etching the first and second work function layers 332, 334, at least one of the pH value of the wet chemical etchant, the concentration of the acid, the concentration of the oxidizer, and the process temperature may be dynamically changed in order to achieve desirable results. Additionally, the top surfaces of the first and second work function layers 332, 334 may be substantially level with each other and/or the etched first and second work function layers 332, 334 may be substantially level with resist layer 408 after the etching process.

Figure 13:
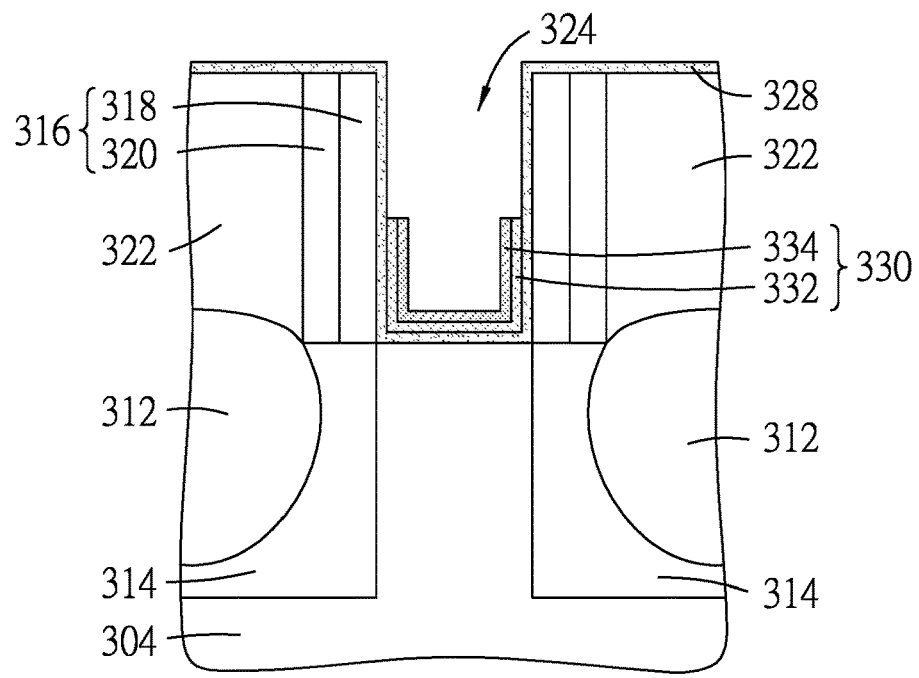

Referring to FIG. 2, in step 216 of the method 200, the resist layer 408 (see FIG. 12) is removed. Referring to FIG. 13, in some embodiments, the resist layer 408 (see FIG. 12) is removed by etching, such as wet etching, plasma dry etching, other suitable techniques, or any combination thereof, while leaving the gate dielectric layer 328, and the first and second work function layers 332, 334 substantially unetched. In some embodiments, plasma dry etching may use an etchant including C, H, O, F, Br, Cl, other suitable etchants, or any combination thereof.

Figure 14:
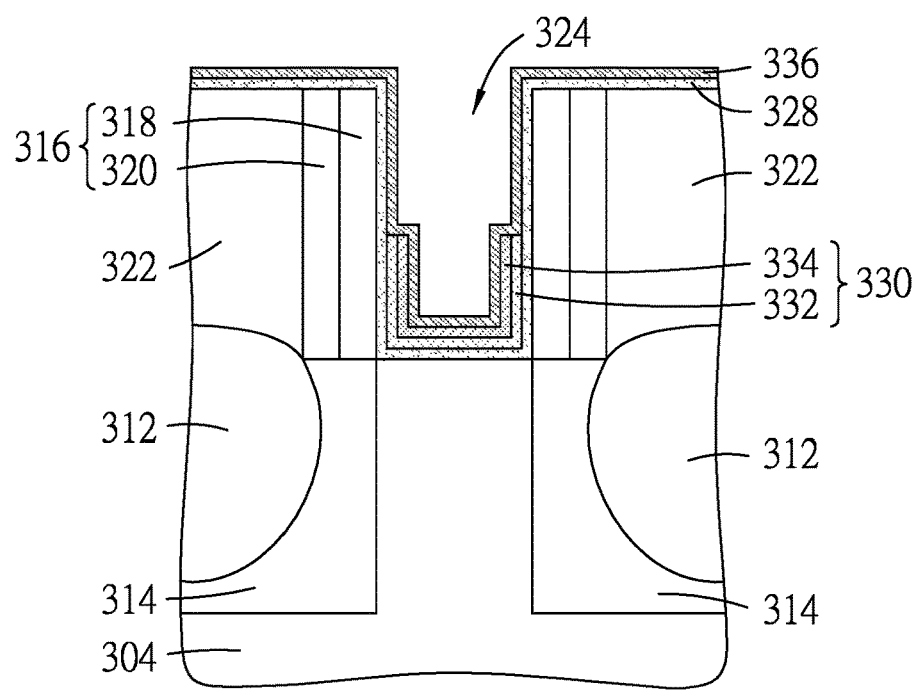

Referring to FIG. 2, in a step 218 of the method 200, a work function feature 336 (see FIG. 14) is formed. Referring to FIG. 14, in some embodiments, the work function feature 336 may be conformally formed in the gate trench 324, on the work function structure 330 and on the gate dielectric layer 328. The work function structure 330 may be made of a p-type work function material or an n-type work function material for further adjusting the work function value of the resulting transistor. The p-type work function material may be WN, Al, Mo, Ru, TiN, TaN, $MoSi_2$, $ZrSi_2$, $TaSi_2$, $NiSi_2$, other suitable materials, or any combination thereof. The n-type work function material may be Ti, Ag, Mn, Zr, TaAl, TiAlN, TaAlC, TaC, TaCN, TaSiN, other suitable materials, or any combination thereof.

Figure 15:
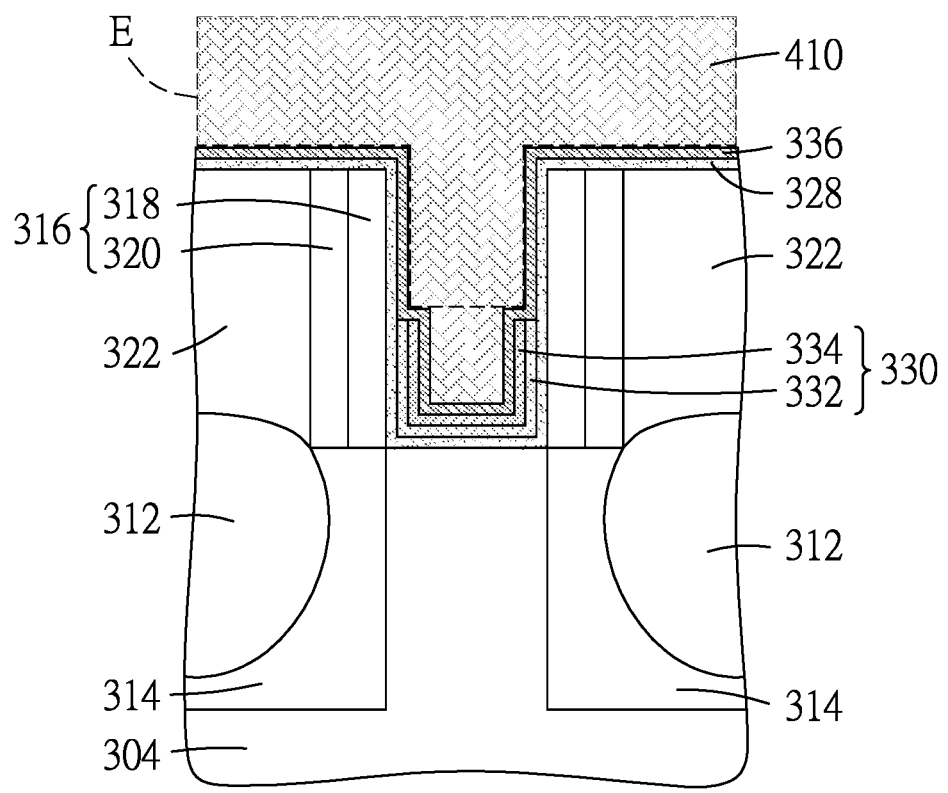
Figure 16:
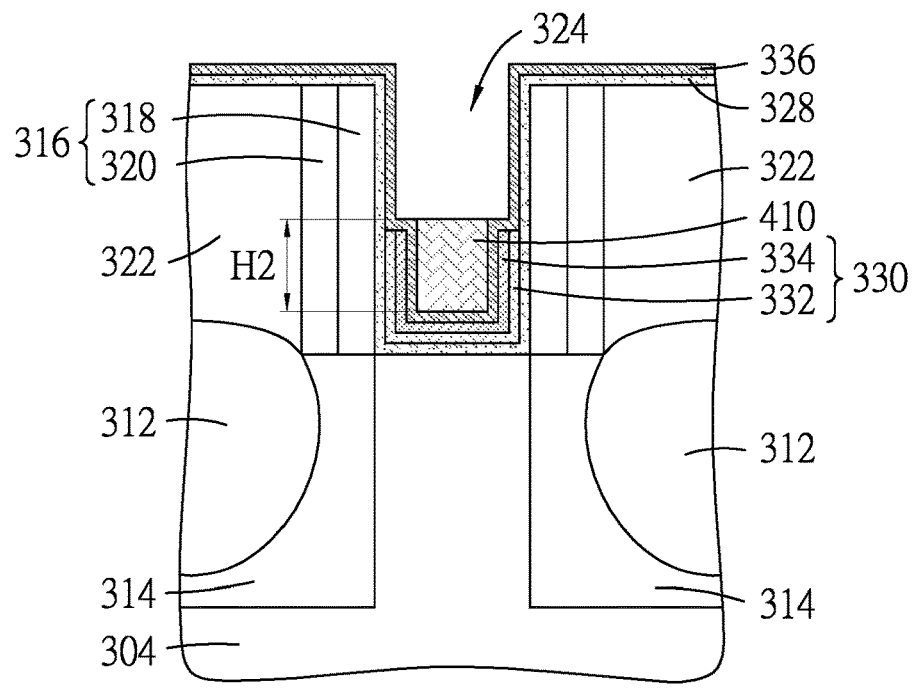
Figure 17:
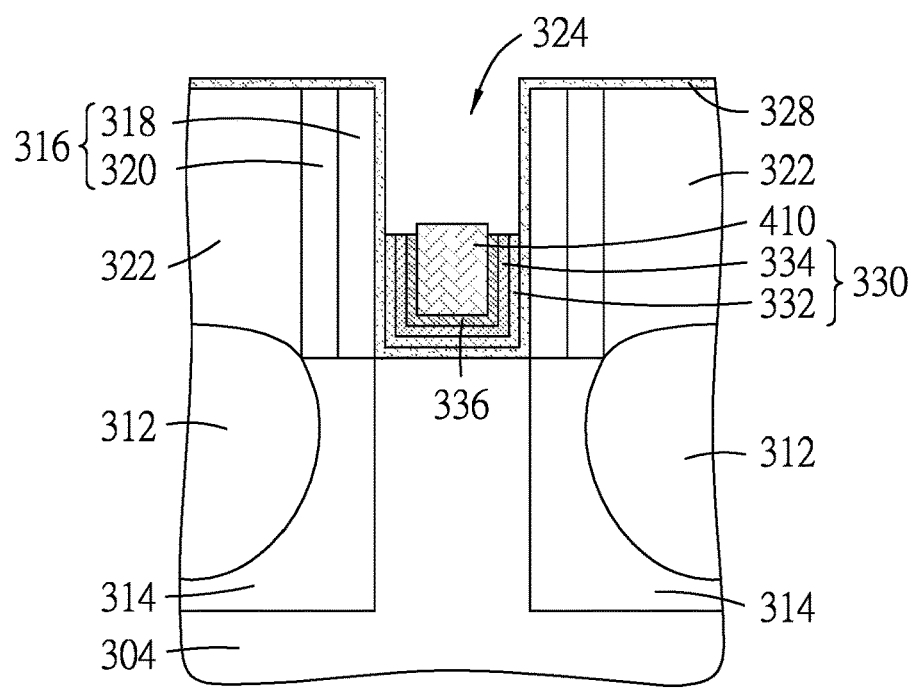
Figure 18:
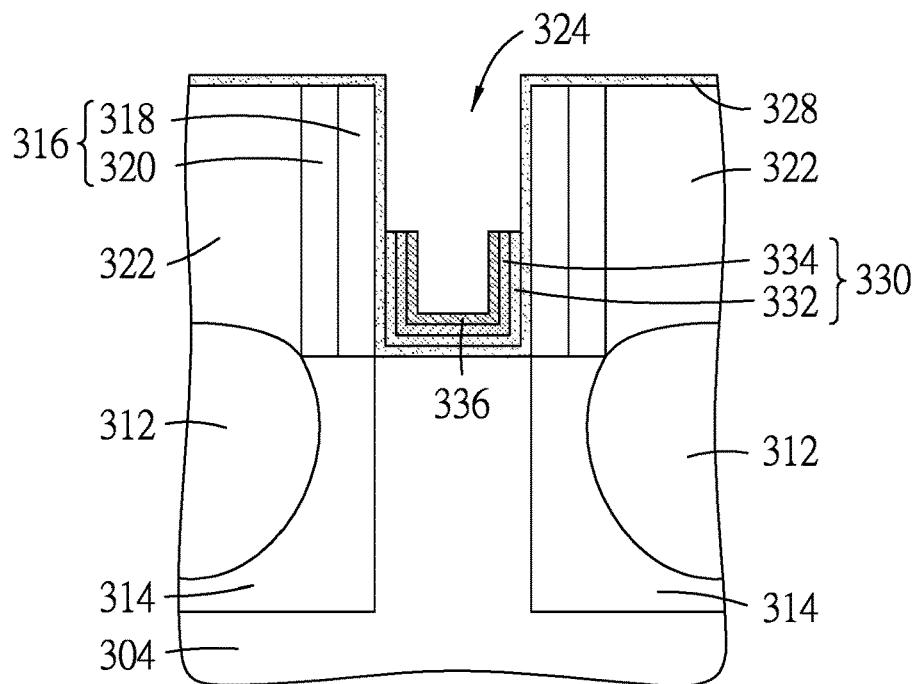

Referring to FIG. 2, in step 220 of the method 200, the work function feature 336 (see FIG. 14) is etched. Referring to FIG. 15, in some embodiments, a resist layer 410 may be formed on the work function feature 336 to fill the gate trench 324 (see FIG. 14). In some embodiments, the resist layer 410 may be made of nitrogen-based material, a carbon-based material, or a polymer-based material. In some embodiments, the resist layer 410 may be an ARC layer made of silicon oxide, silicon nitride, silicon oxynitride, other suitable materials, or any combination thereof. In some embodiments, the resist layer 410 may be made of an organic material that contains at least one of: H, C, O, etc.; a compound material including SiO, $SiO_2$, $MgF_2$, $Cr_2O_3$, ITO, $Si_3N_4$, $TaO_5$, $Al_2O_3$, TiN, ZrO, etc.; a metal-based material including In, Al, Ag, Au, etc.; other suitable materials; or any combination thereof. In some embodiments, the resist layer 410 may be formed by ALD, CVD (e.g., PECVD, etc.), spin coating, other suitable techniques, or any combination thereof. In some embodiments, the resist layer 410 may be a multilayer including a bottom anti-reflective coating (BARC), a middle layer (ML), and a photoresist layer (PR). Then, referring to FIG. 16, a top portion (E) (see FIG. 15) of the resist layer 410 is removed. In some embodiments, the top portion (E) of the resist layer 410 may be removed by etching, such as wet etching, plasma dry etching, other suitable techniques, or any combination thereof. In some embodiments, plasma dry etching may use an etchant including C, H, O, F, Br, Cl, other suitable etchants, or any combination thereof. In some embodiments, the top portion (E) of the resist layer 410 is removed to lower the resist layer 410 in the gate trench 324 to a height (H2). The value of the height (H2) of the resist layer 410 may be similar to the values of the height (H1) as described above, and may be adjusted according to practical requirements. Then, referring to FIG. 17, the work function feature 336 is selectively etched using the resist layer 410 as a mask. The etching process may be carried out using a wet chemical etchant, such that the work function feature 336 is lowered to be no higher than the resist layer 410 (see FIG. 16) with the gate dielectric layer 328 being substantially unetched. In some embodiments, the etched work function feature 336 may be substantially level with the resist layer 410; and, in other embodiments, the etched work function feature 336 may be slightly lower than the resist layer 410. In some embodiments, the etched work function feature 336 may be substantially level with the etched first and second work function layers 332, 334; and, in other embodiments, the etched work function feature 336 may be higher or lower than the etched first and second work function layers 332, 334. In some embodiments, the wet chemical etchant may include a mixture of an acid (e.g., hydrochloric acid or other suitable kinds of acid) and an oxidizer (e.g., $H_2O_2$, ozone, other suitable materials, or any combination thereof). In some embodiments, a volume percentage of the acid based on the wet chemical etchant may range from about 0.01% to about 1% (other range vales are also within the scope of this disclosure), and a volume percentage of the oxidizer based on the wet chemical etchant may range from about 0.1% to about 10% (other range vales are also within the scope of this disclosure). If the concentration of the acid is too low, such as less than about 0.01%, the wet chemical etchant may not be able to complete the etching process due to its low concentration. If the concentration of the acid is too high, such as greater than about 1%, the work function feature 336 may be over-etched, rendering the work function feature 336 to be considerably lower than the resist layer 410. If the concentration of the oxidizer is too low, such as less than about 0.1%, the wet chemical etchant may not be able to complete the etching process due to insufficient oxidizer. If the concentration of the oxidizer is too high, such as greater than about 10%, the work function feature 336 may be over-etched, rendering the work function feature 336 to be considerably lower than the resist layer 410. In some embodiments, the process of etching the work function feature 336 may be carried out under temperatures ranging from about 20° C. to about 60° C., but other range vales are also within the scope of this disclosure. If the temperature of the etching process is too low, such as lower than about 20° C., the wet chemical etchant may not be able to complete the etching process. If the temperature of the etching process is too high, such as higher than about 60° C., the work function feature 336 may be over-etched, rendering the work function feature 336 to be considerably lower than the resist layer 410. In some embodiments, during the process of etching the work function feature 336, at least one of the pH value of the wet chemical etchant, the concentration of the hydrochloric acid, the concentration of the oxidizer, and the process temperature may be dynamically changed in order to achieve desirable results. Additionally, the work function feature 336 may be substantially level with resist layer 410 after the process of etching. Then, referring to FIG. 18, the resist layer 410 (see FIG. 17) may be removed by etching, such as wet etching, plasma dry etching, other suitable techniques, or any combination thereof, while leaving the gate dielectric layer 328, the work function feature 336, and the first and second work function layers 332, 334 substantially unetched. In some embodiments, plasma dry etching may use an etchant including C, H, O, F, Br, Cl, other suitable etchants, or any combination thereof.

Figure 19:
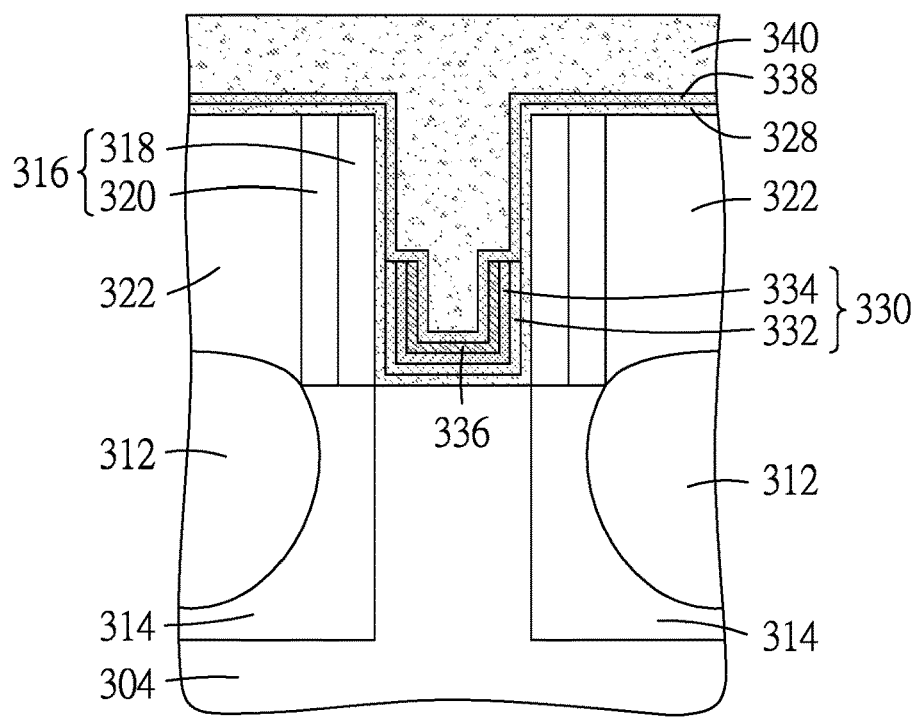
Figure 20:
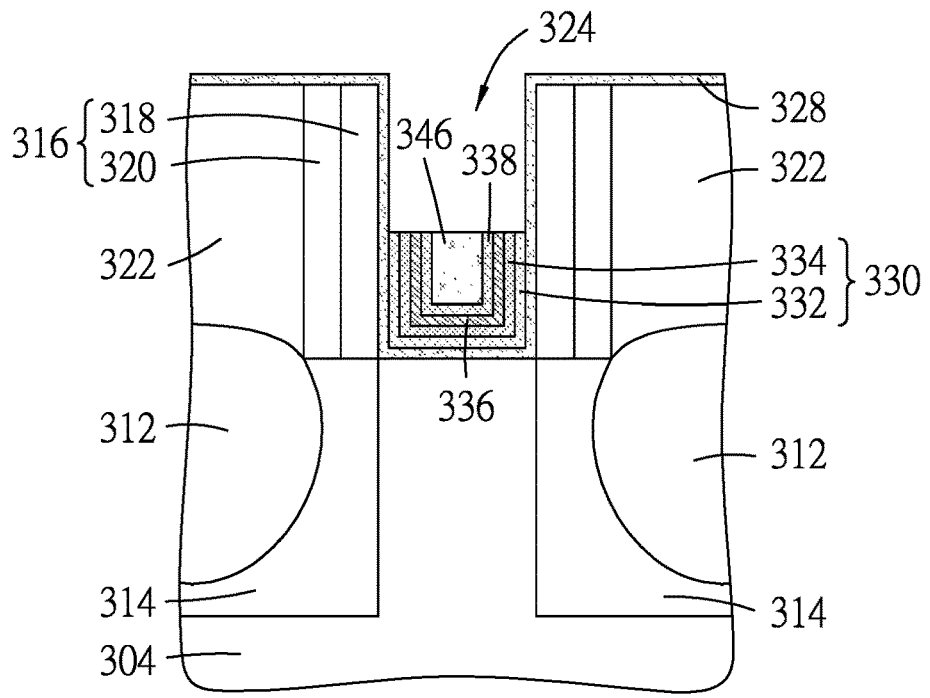
Figure 21:
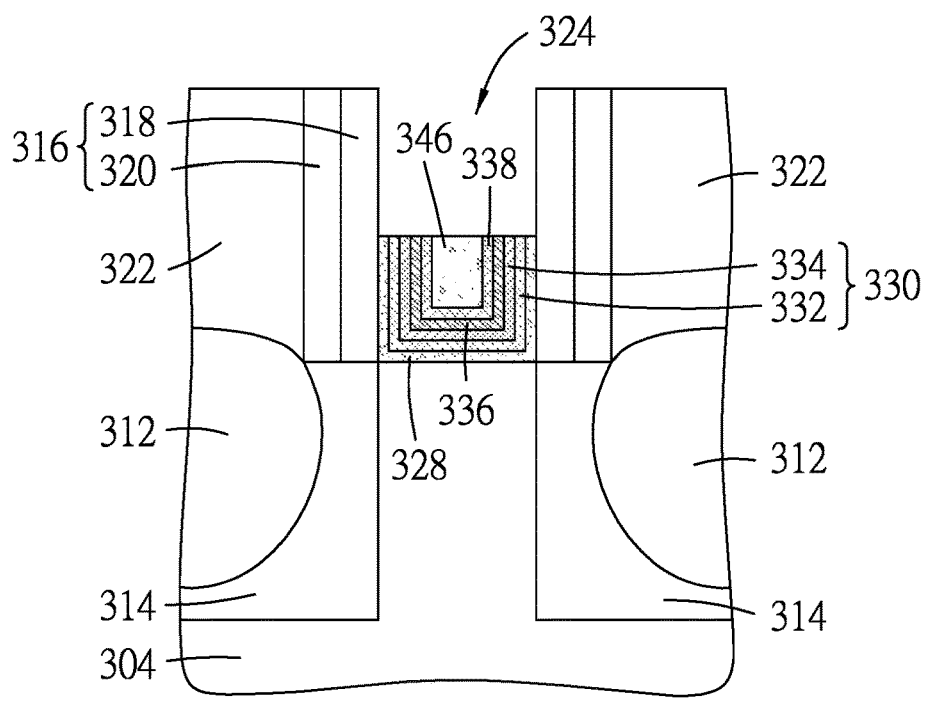

Referring to FIG. 2, in step 222 of the method 200, a conductive gate 346 (see FIG. 20) is formed. Referring to FIG. 19, in some embodiments, a glue layer 338 may be conformally formed in the gate trench 324 and on the first and second work function layers 332, 334, the work function feature 336, and the gate dielectric layer 328, which is then followed by depositing a conductive fill material 340 on the glue layer 338 to fill the gate trench 324. In some embodiments, the glue layer 338 may include W, Al, Ta, Ti, Ni, Cu, Co, metal nitride (e.g., TiN, etc.), other suitable materials, or any combination thereof. In some embodiments, the glue layer 338 may be formed by ALD, CVD, PVD, other suitable techniques, or any combination thereof. In some embodiments, the conductive fill material 340 may include W, Al, Ta, Ti, Ni, Cu, Co, other suitable materials, or any combination thereof. In some embodiments, the conductive fill material 340 may be formed by ALD, CVD, PVD, plating, other suitable techniques, or any combination thereof. Then, referring to FIG. 20, in some embodiments, portions of the glue layer 338 and the conductive fill material 340 are removed (e.g., by wet chemical etching or other suitable techniques), thereby obtaining a conductive gate 346 disposed in the gate trench 324. Referring to FIG. 21, in some embodiments, portions of the gate dielectric layer 328 disposed over the spacer 316 and the ILD dielectrics 322 and disposed on side wall of the first spacer portion 318 may be removed by dry etch or other suitable techniques.

Figure 22:
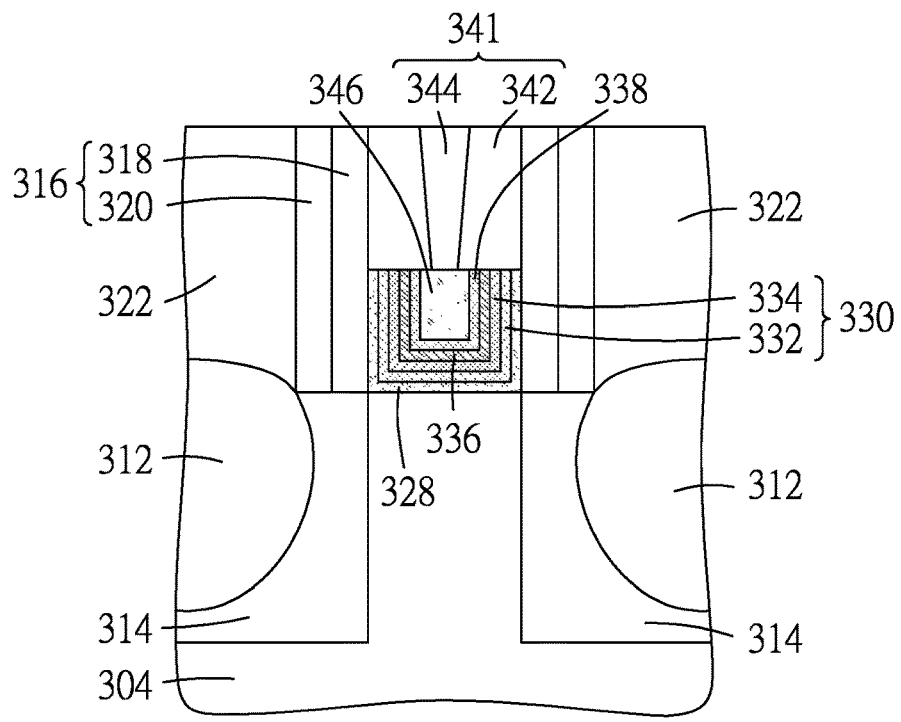

Referring to FIG. 2, in step 222 of the method 200, a contact structure 341 (see FIG. 22) is formed. Referring to FIG. 22, in some embodiments, the contact structure 341 includes a dielectric layer 342 that is formed in the gate trench 324, and a contact 344 that is formed in the dielectric layer 342 and that is electrically connected to the conductive gate 346. In some embodiments, the dielectric layer 342 may be made of silicon oxide, silicon nitride, a suitable low-k material, other suitable materials, or any combination thereof, and may be made by CVD, ALD, other suitable techniques, or any combination thereof. In some embodiments, the contact 344 may be made of Cu, Al, W, other suitable materials, or any combination thereof, and may be made by PVD, electroplating, electroless plating, other suitable techniques, or any combination thereof.

Figure 8:
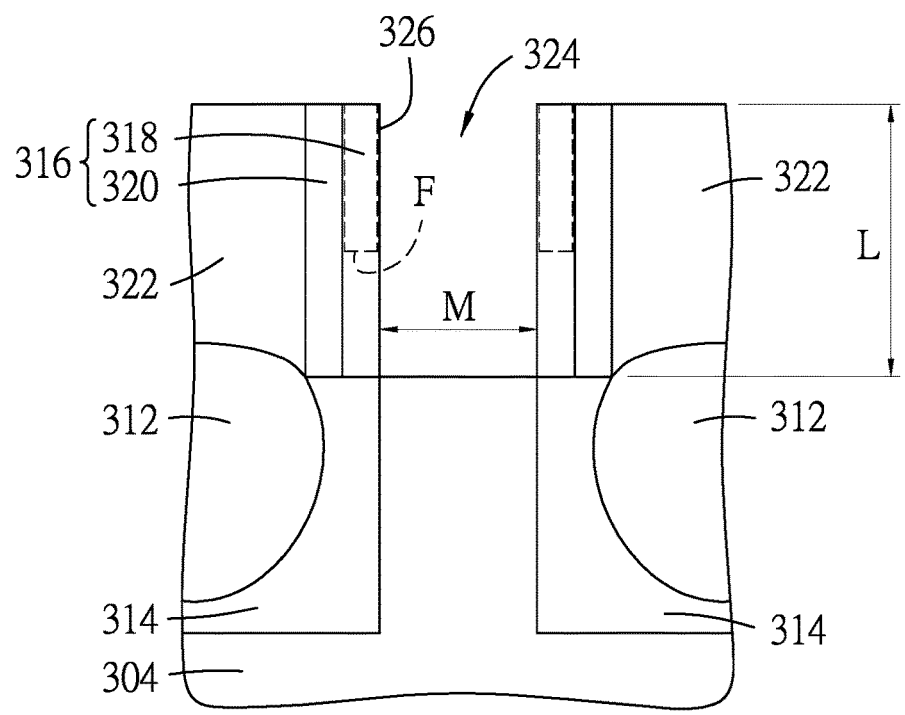
Figure 23:
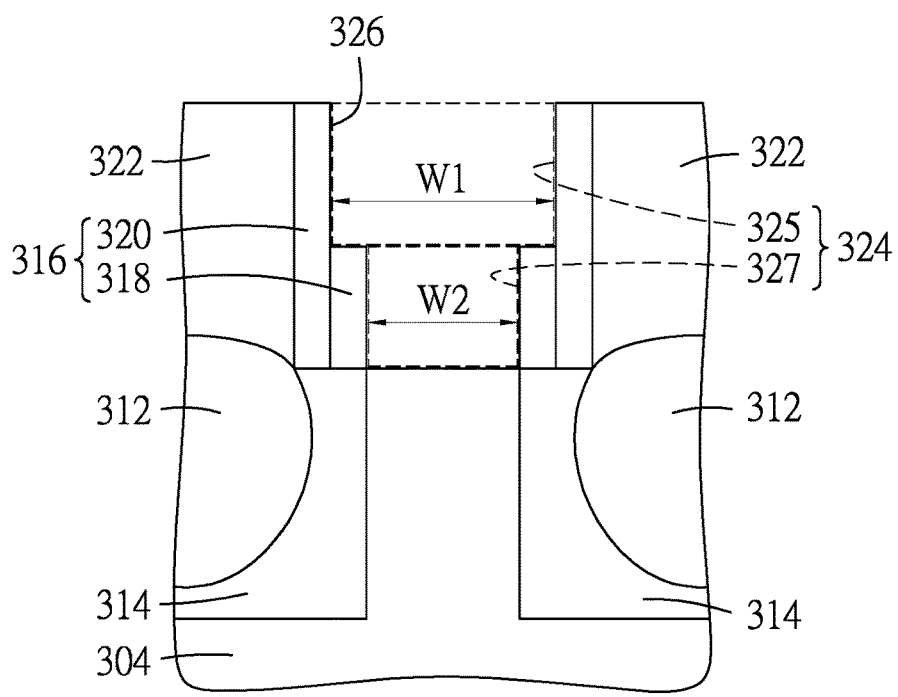
FIGS. 23 to 34 are schematic views showing intermediate steps of a method of forming a semiconductor device in accordance with some embodiments of this disclosure.

FIG. 23 is a variation of FIG. 8, where, in FIG. 23, an upper portion (F) (see FIG. 8) of the first spacer portion 318 of the spacer 316 may be removed by dry etch using a suitable etchant having a higher etching rate for the first spacer portion 318, without substantially etching the second spacer portion 320, such that a width (W1) of an upper portion 325 of the gate trench 324 is greater than a width (W2) of a lower portion 327 of the gate trench 324. In some embodiments, the width (W1) of the upper portion 325 of the gate trench 324 may range from about 12 nm to about 150 nm, but other ranges of values are also within the scope of this disclosure. Examples of the width (W1) may range from about 12 nm to about 30 nm, from about 30 nm to about 55 nm, from about 55 nm to about 150 nm, and may be adjusted according to practical requirements. In some embodiments, if the width (W1) is too small, such as smaller than about 12 nm, it may be difficult to deposit work function materials therein. In some embodiments, if the width (W1) is too large, such as greater than about 150 nm, the resulting structure may occupy a large space. In some embodiments, the width (W2) of the lower portion 327 of the gate trench 324 may range from about 9 nm to about 55 nm, but other ranges of values are also within the scope of this disclosure. Examples of the width (W2) may range from about 9 nm to about 12 nm, from about 12 nm to about 30 nm, from about 30 nm to about 55 nm, and may be adjusted according to practical requirements. In some embodiments, if the width (W2) is too small, such as smaller than about 9 nm, it may be difficult to deposit work function materials therein. In some embodiments, if the width (W2) is too large, such as greater than about 55 nm, the resulting structure may occupy too much space. In some embodiments, the first spacer portion 318, the second spacer portion 320 and the fin 304 cooperatively define the trench-defining wall 326.

Figure 24:
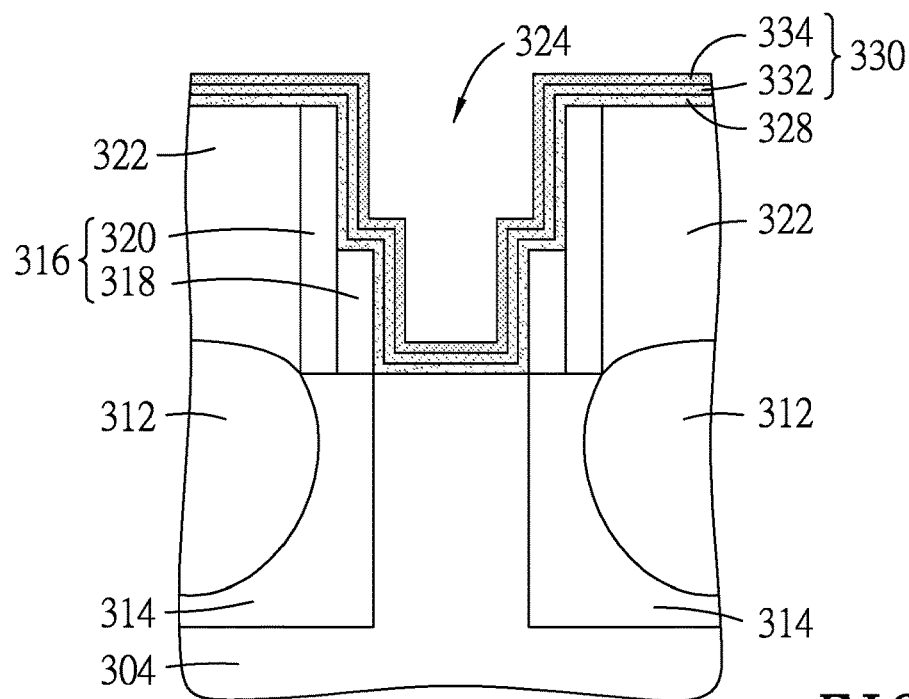
Figure 25:
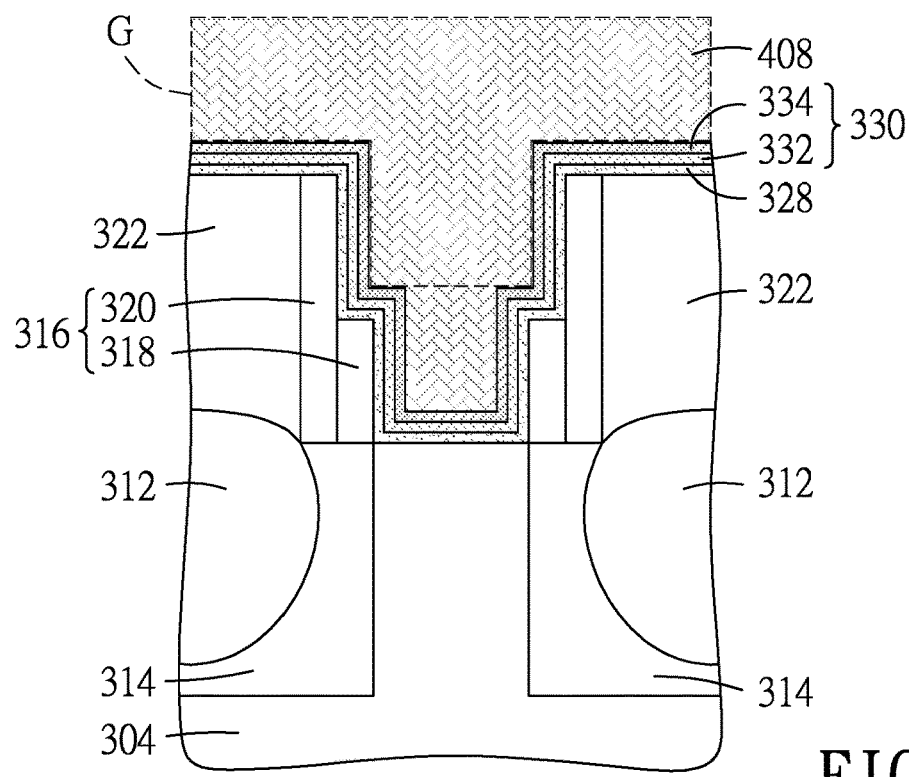
Figure 26:
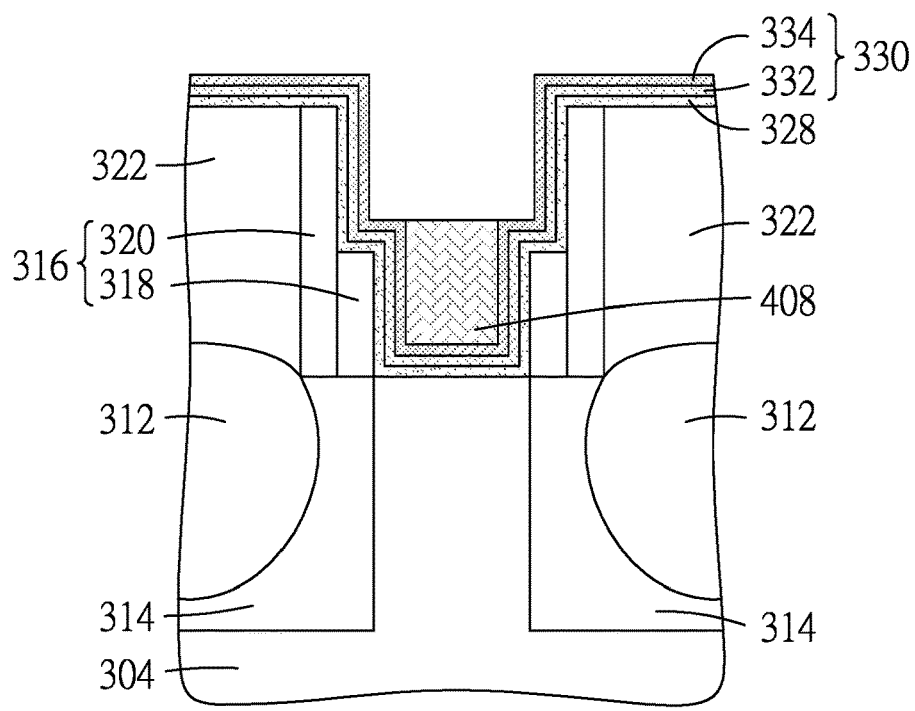
Figure 27:
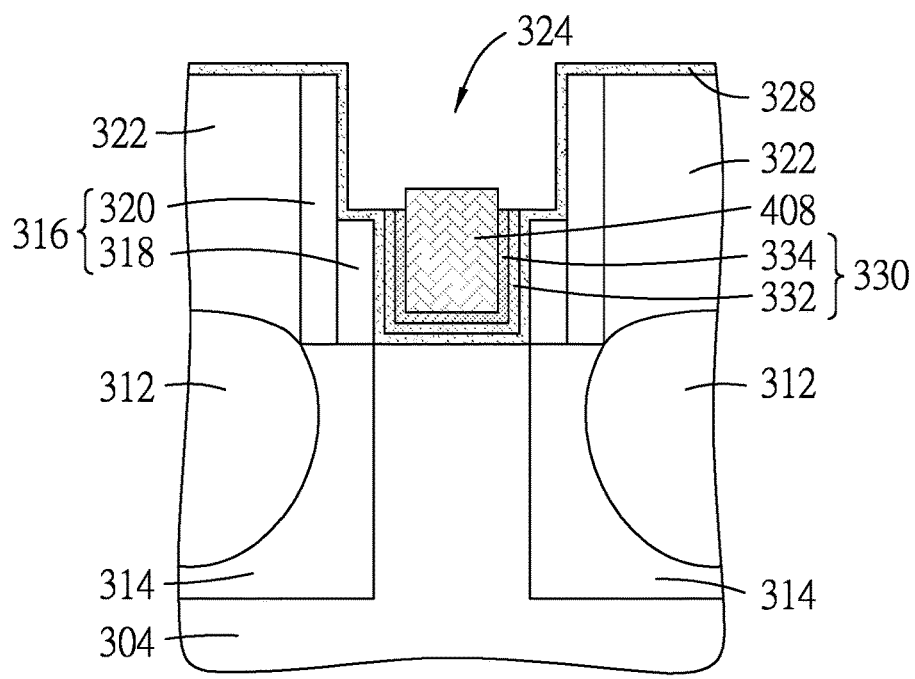
Figure 28:
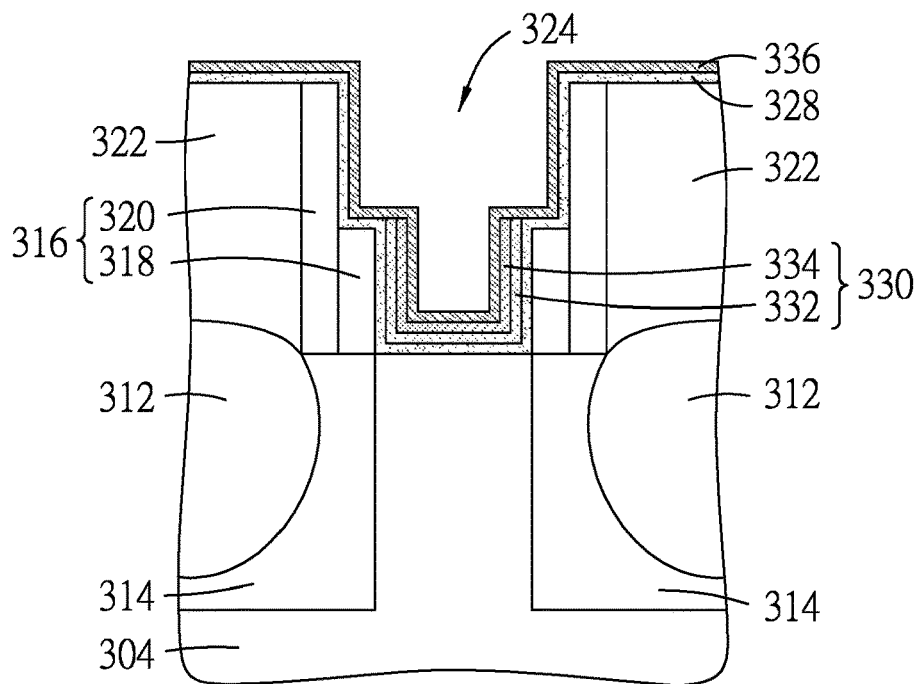
Figure 29:
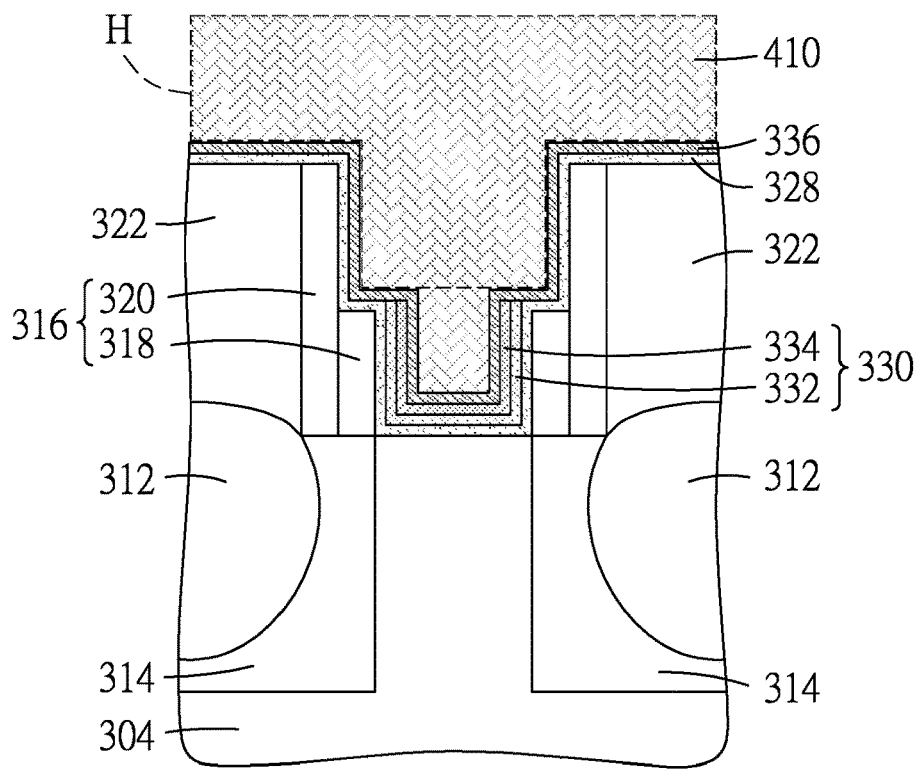
Figure 30:
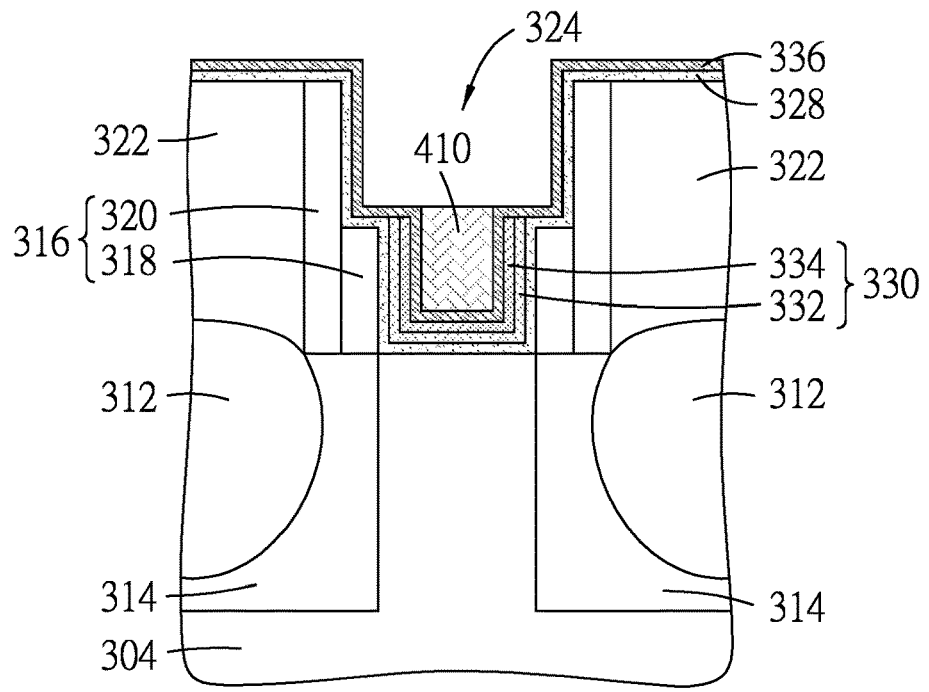
Figure 31:
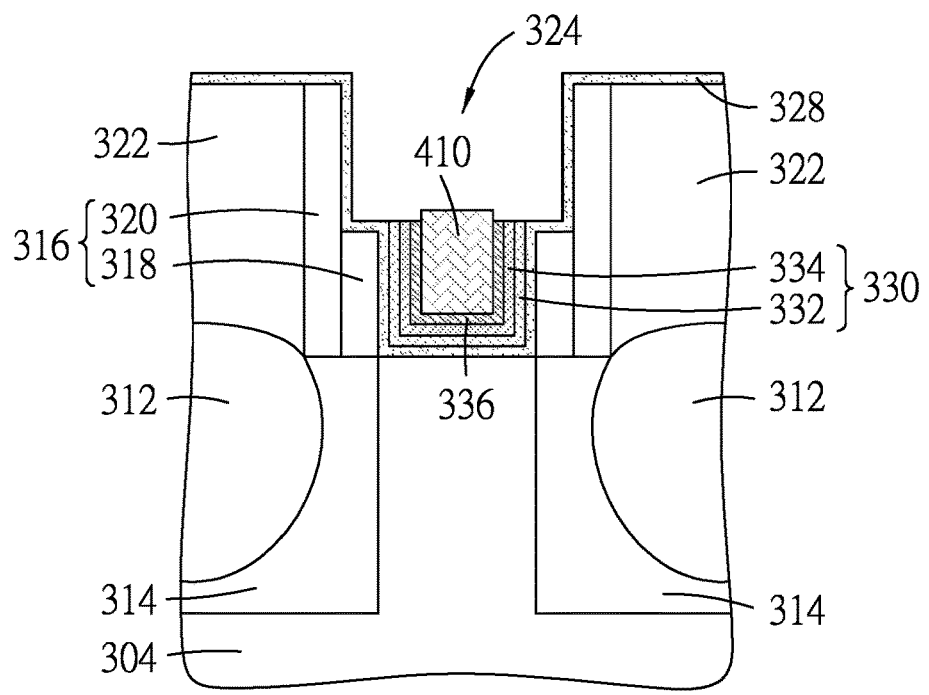
Figure 32:
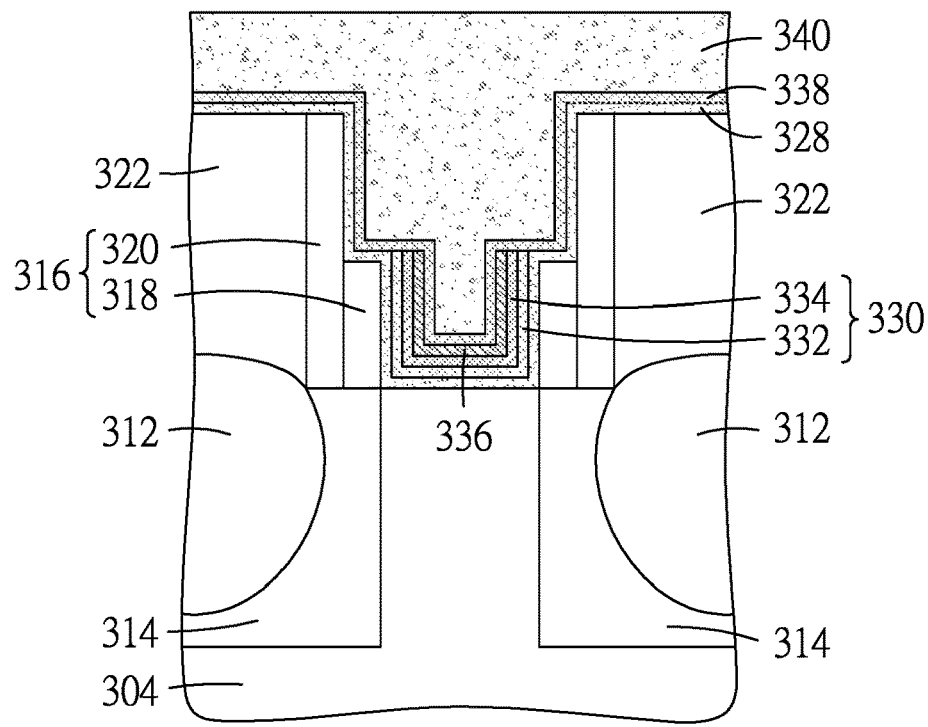
Figure 33:
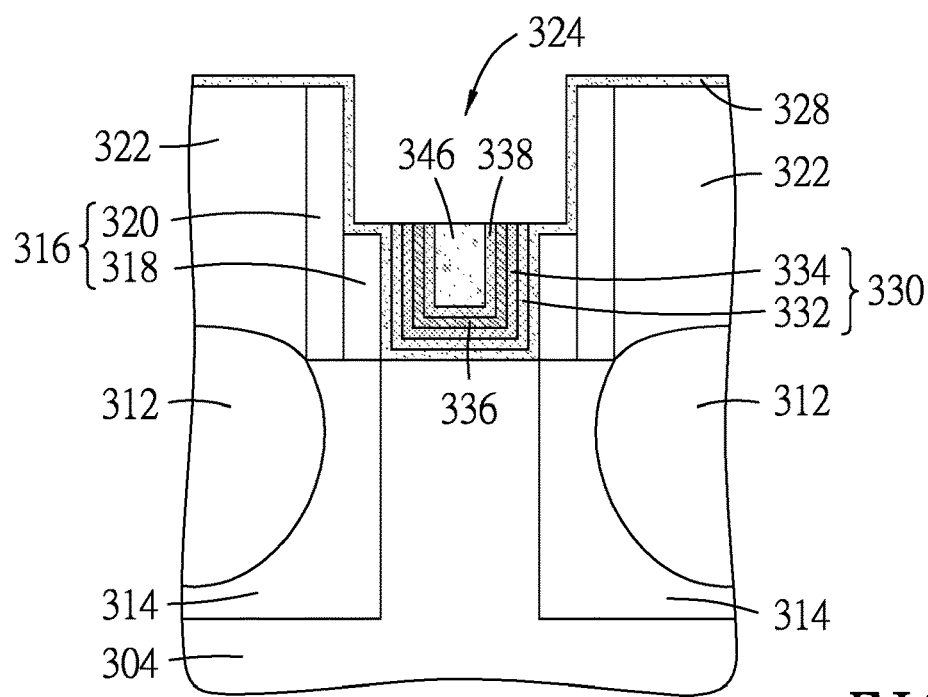
Figure 34:
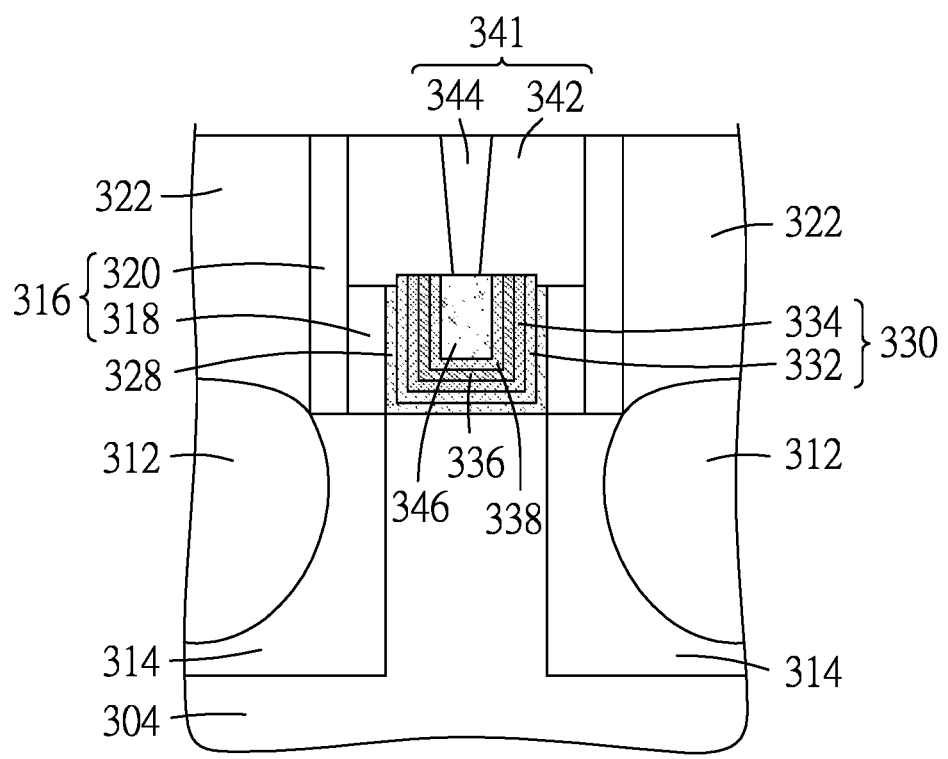

Referring to FIG. 24, in some embodiments, the gate dielectric layer 328 is formed on the trench-defining wall 326 and over the spacer 316 and the ILD dielectrics 322, followed by forming the work function structure 330 on the gate dielectric layer 328. In some embodiments, the work function structure 330 may include the first and second work function layers 332, 334 as described above. Then, referring to FIG. 25, the resist layer 408 as described above is formed. In some embodiments, the resist layer 408 may be formed on the second work function layer 334 of the work function structure 330 to fill the gate trench 324 (see FIG. 24). Then, referring to FIG. 26, in some embodiments, a top portion (G) of the resist layer 408 (see FIG. 26) may be removed, leaving the resist layer 408 in a lower portion of the gate trench 324. Then, referring to FIG. 27, the first and second work function layers 332, 334 of the work function structure 330 may be selectively etched using the resist layer 408 as a mask, such that the first and second work function layers 332, 334 are lowered to be no higher than the resist layer 408 with top surfaces first and second work function layers 332, 334 substantially level with each other, and the gate dielectric layer 328 is substantially unetched. In some embodiments, the etched first and second work function layers 332, 334 may be substantially level with the resist layer 408; and, in other embodiments, the etched first and second work function layers 332, 334 may be slightly lower than the resist layer 408. The etching process may be carried out using suitable wet chemical etchants as described above. Then, referring to FIG. 28, the resist layer 408 (see FIG. 27) is removed, followed by forming the work function feature 336 on the work function structure 330 and on the gate dielectric layer 328, as described above. Then, the resist layer 410 as described above is formed, followed by removing a top portion (H) of the resist layer 410 to obtain the structure shown in FIG. 30. Then, referring to FIG. 31, in some embodiments, the work function feature 336 is etched using the resist layer 410 as a mask, as described above. Then, referring to FIG. 32, the resist layer 410 (see FIG. 31) is removed, followed by forming the glue layer 338 and the conductive fill material 340 as described above. Then, referring to FIG. 33, portions of the glue layer 338 and the conductive fill material 340 are removed to form the conductive gate 346, as described above. Then, referring to FIG.

34, portions of the gate dielectric layer 328 are removed, followed by forming the dielectric layer 342 and the contact 344, as described above.

Figure 35:
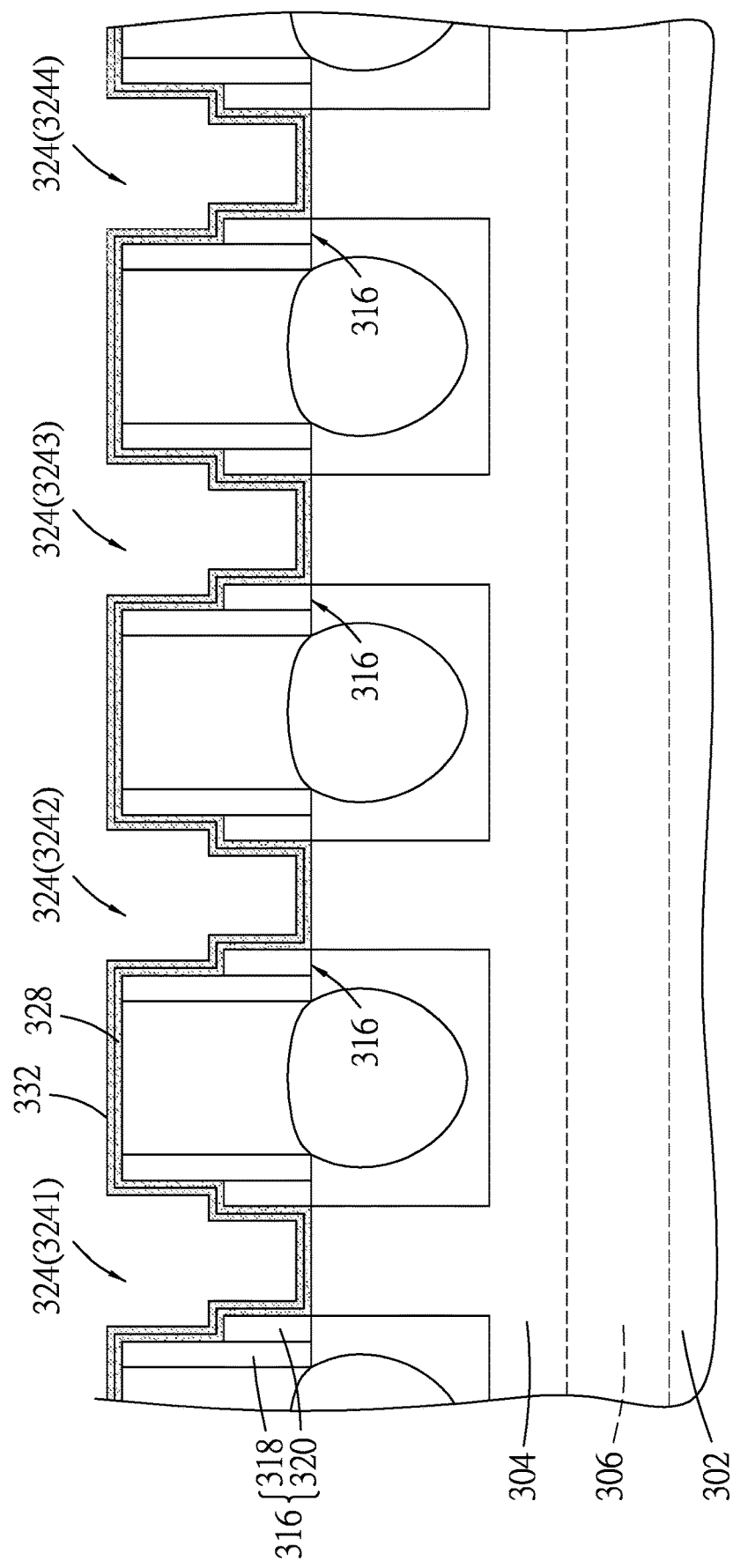
FIGS. 35 to 46 are schematic views showing intermediate steps of a method of forming various combinations of work function materials.

FIG. 35 is a schematic sectional view showing four of the gate trenches 324 (e.g., first to fourth gate trenches 3241 to 3244) that are defined by the spacers 316 for illustrating the deposition of different combinations of work function materials. As shown in FIG. 35, in some embodiments, the gate dielectric layer 328 may be formed in the first to fourth gate trenches 3241 to 3244 and on the spacers 316, followed by forming the first work function layer 332 on the gate dielectric layer 328.

Figure 36:
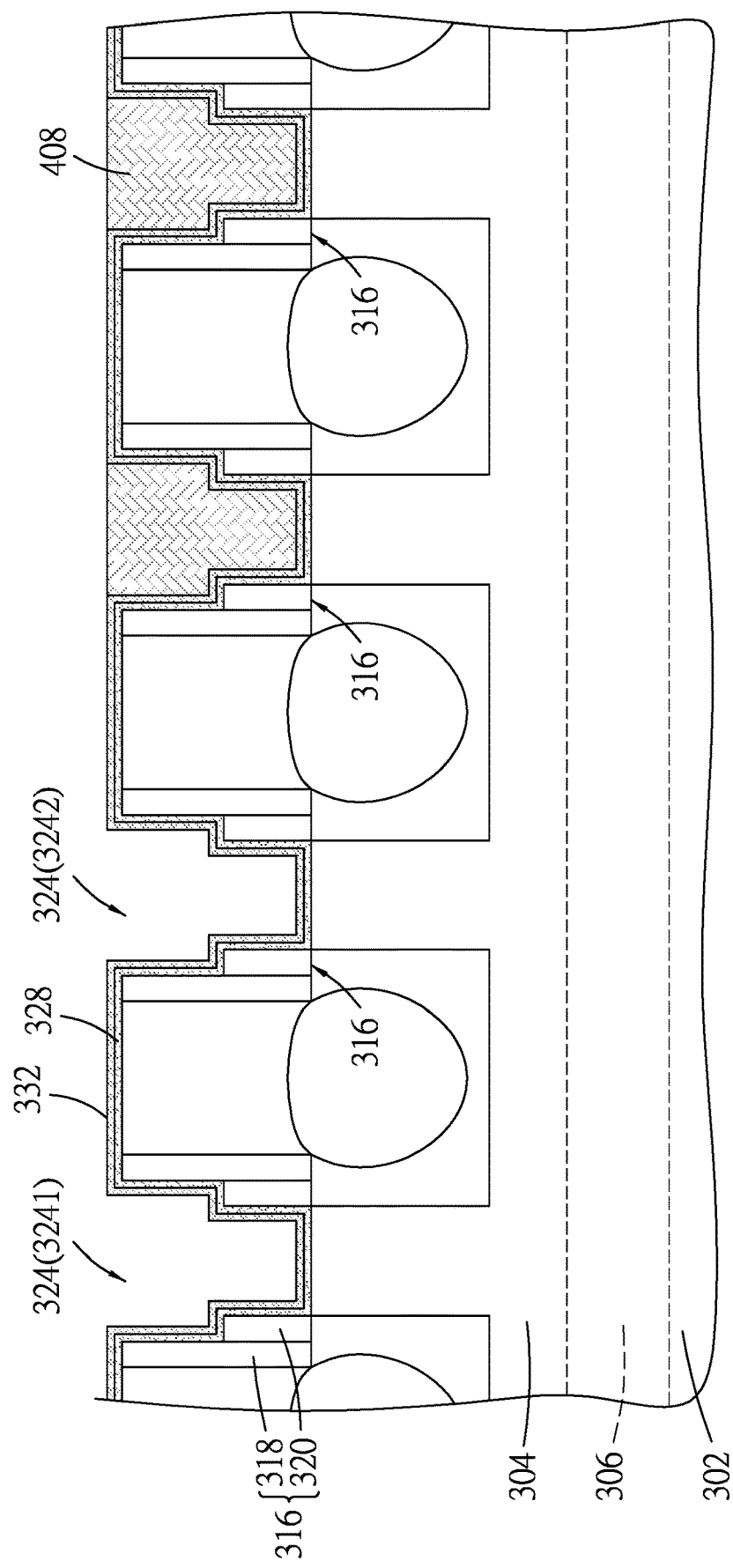
Figure 37:
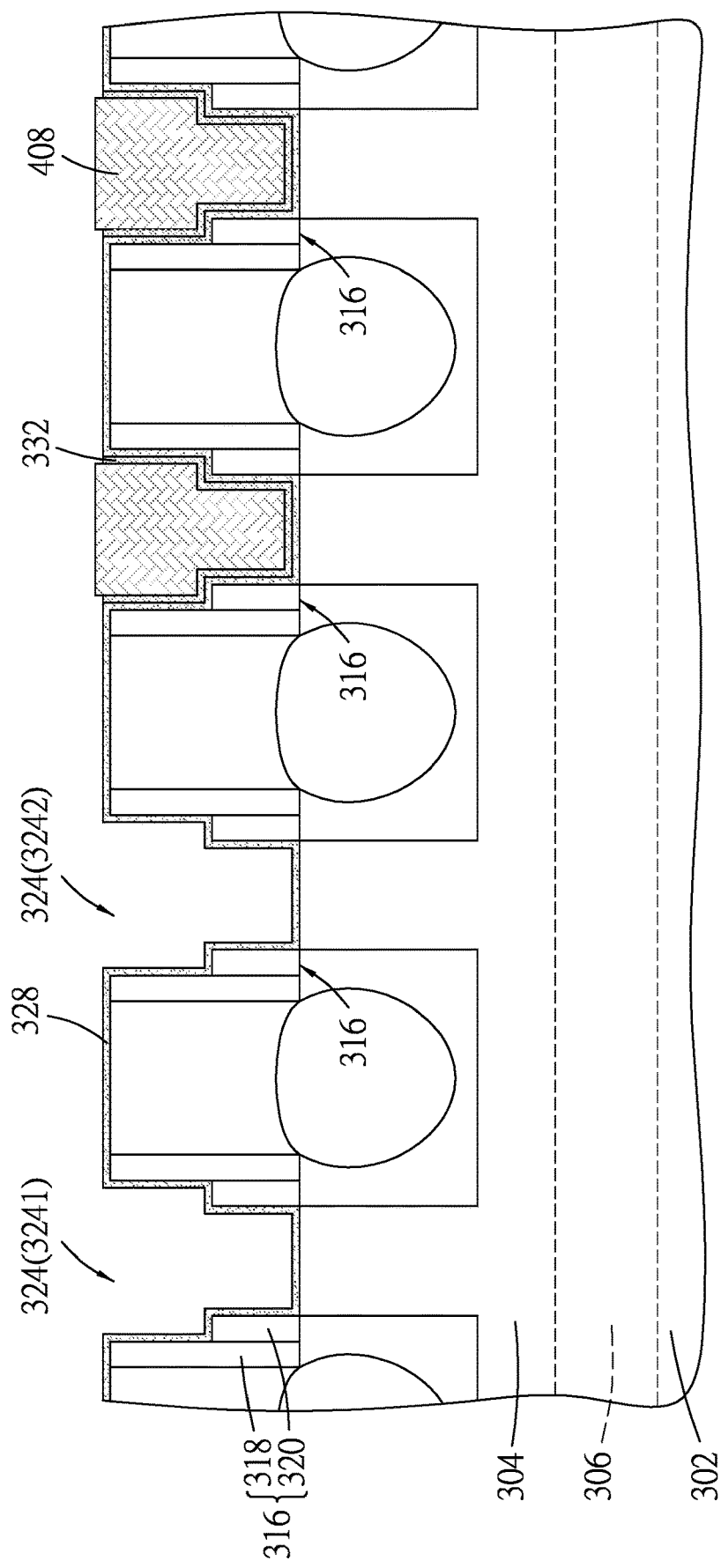
Figure 38:
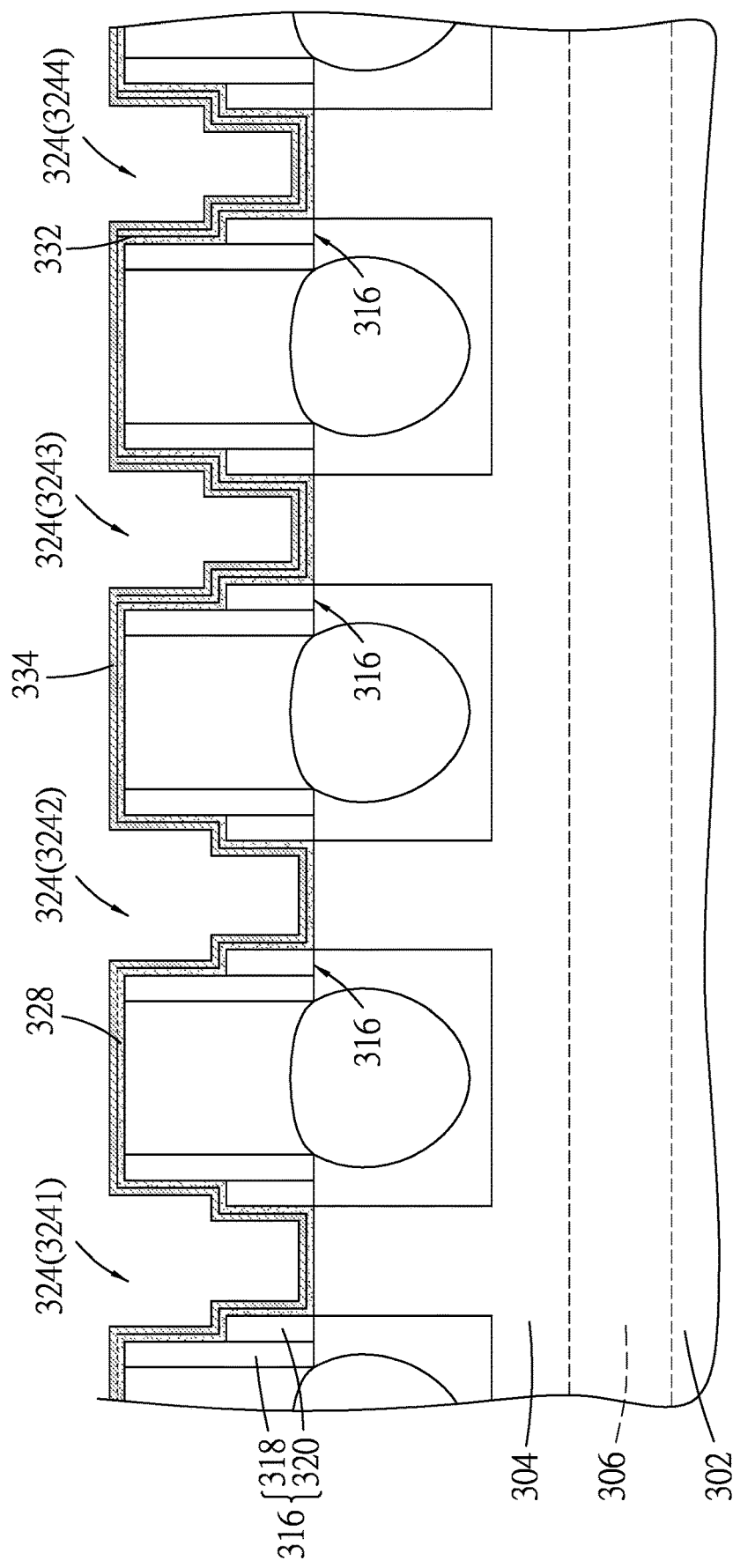
Figure 39:
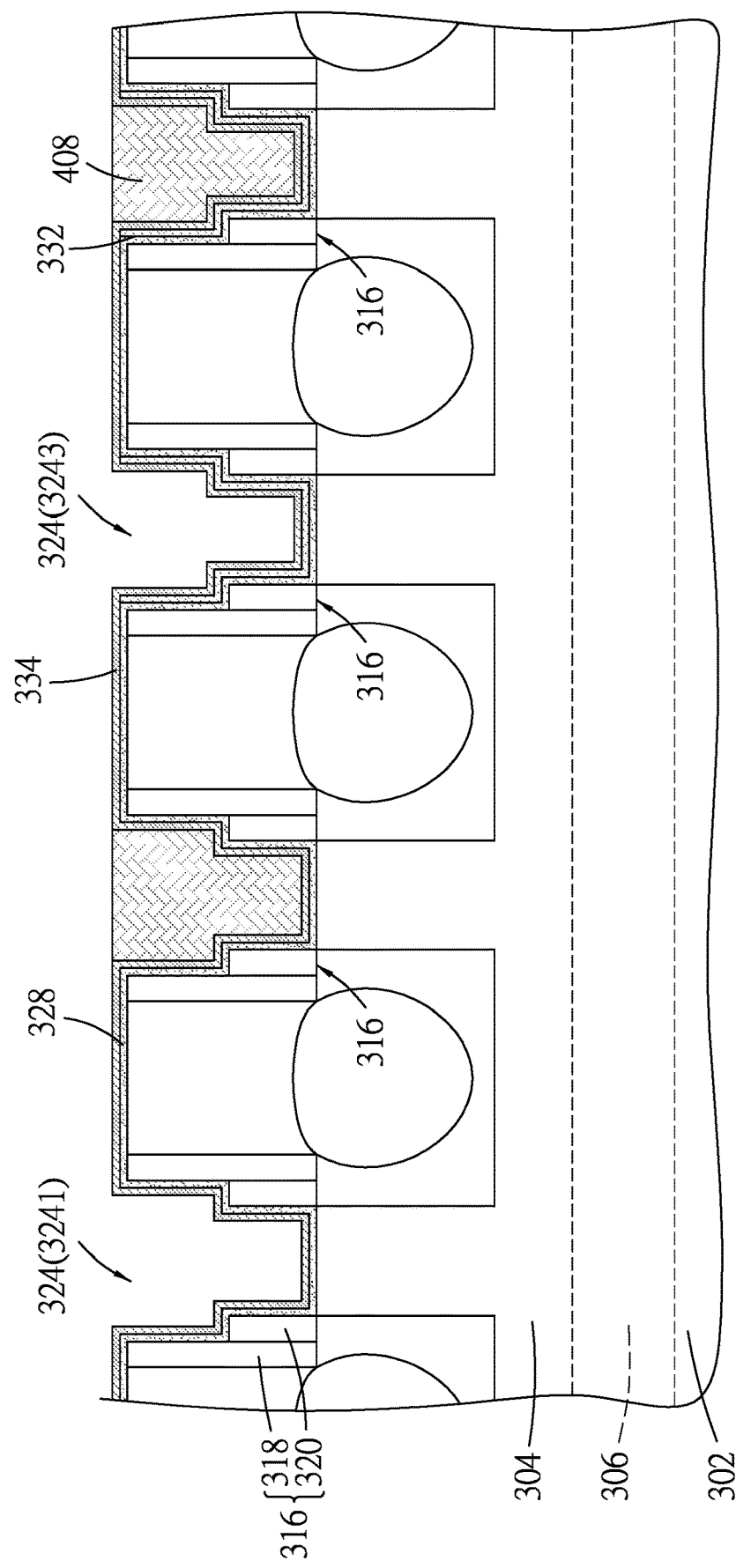
Figure 40:
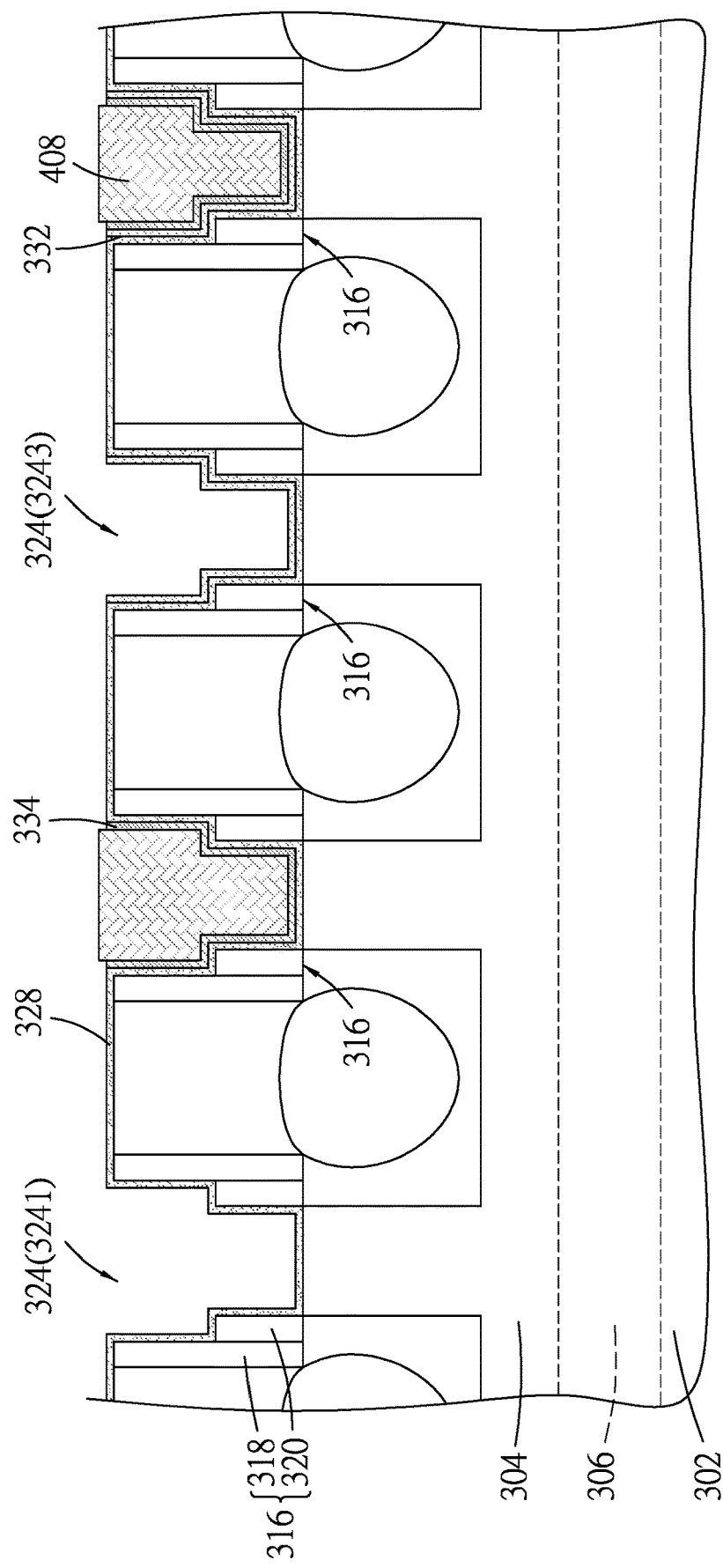
Figure 41:
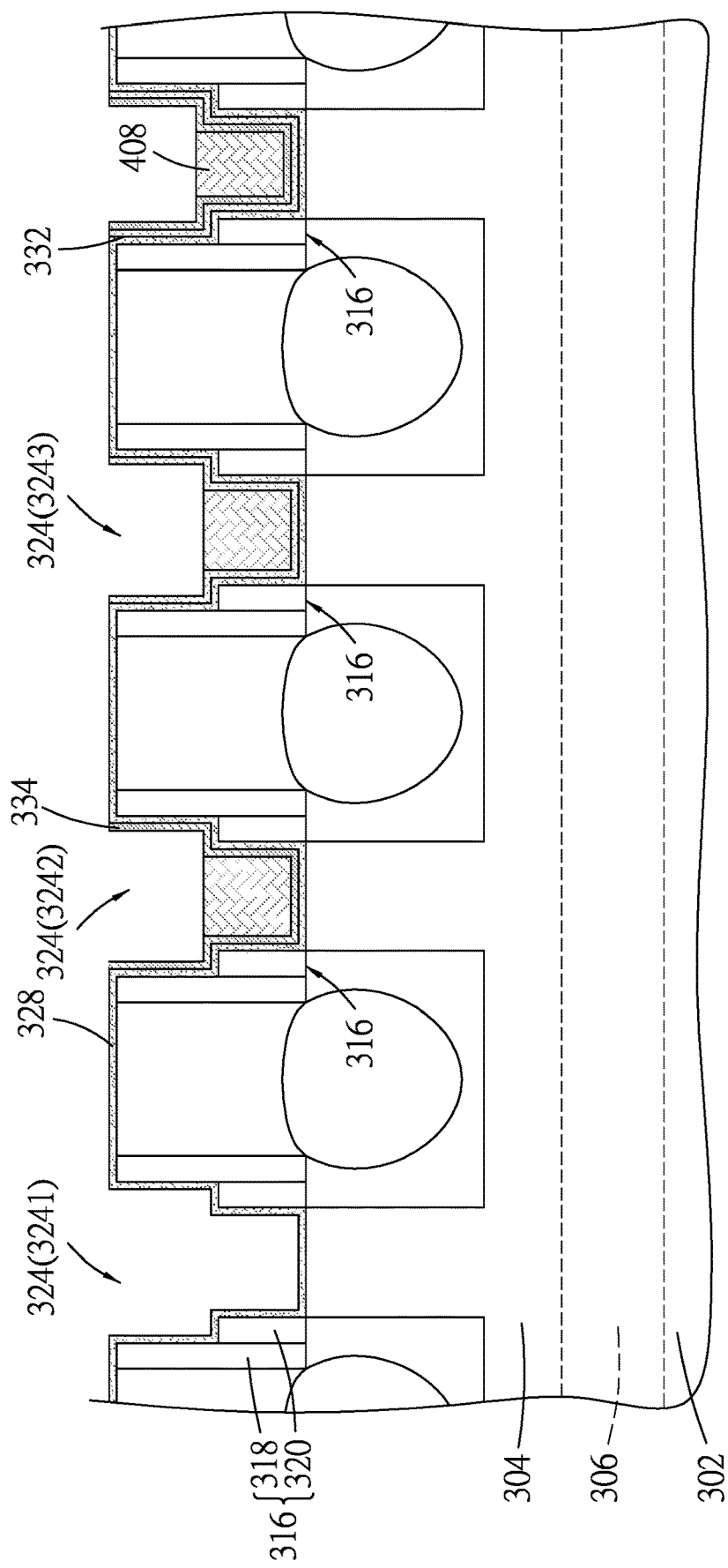
Figure 42:
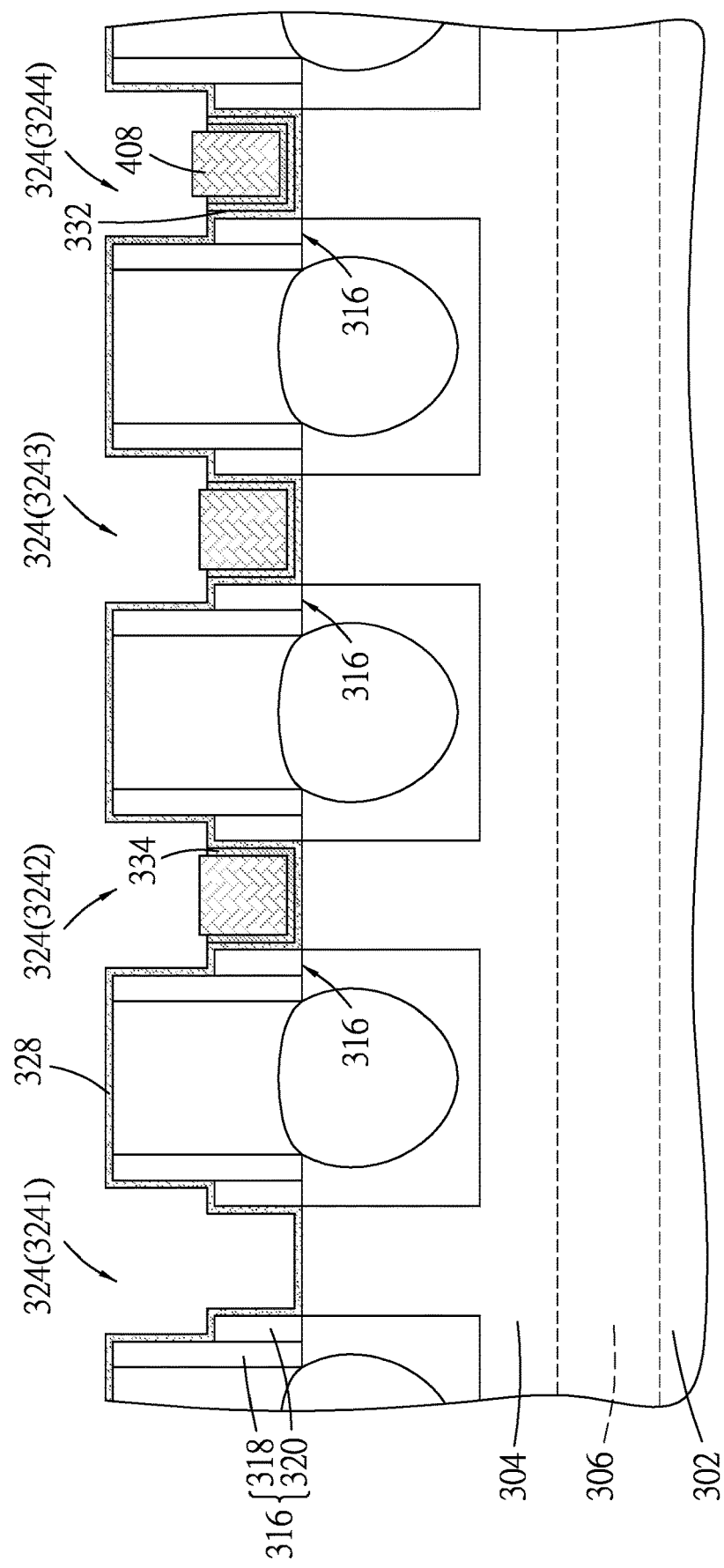
Figure 43:
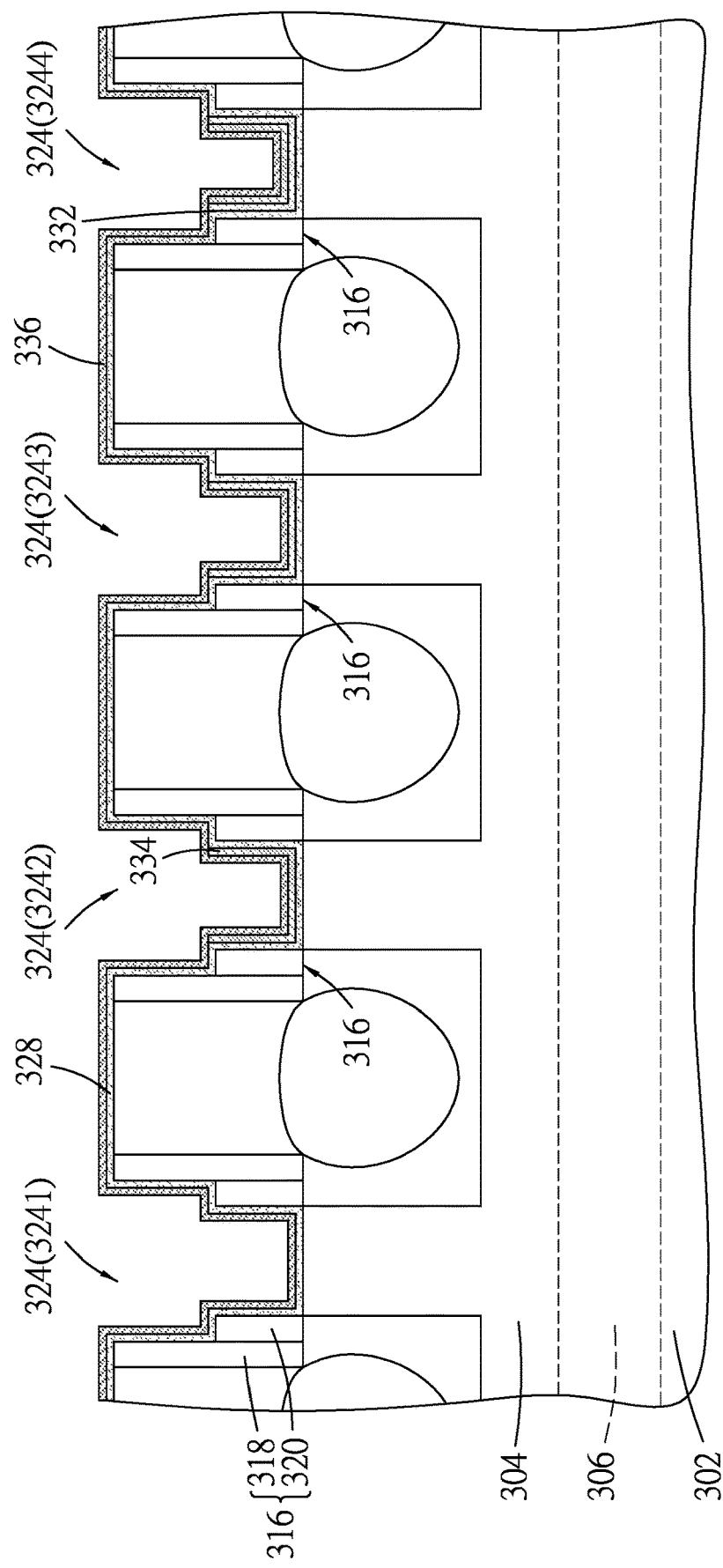
Figure 44:
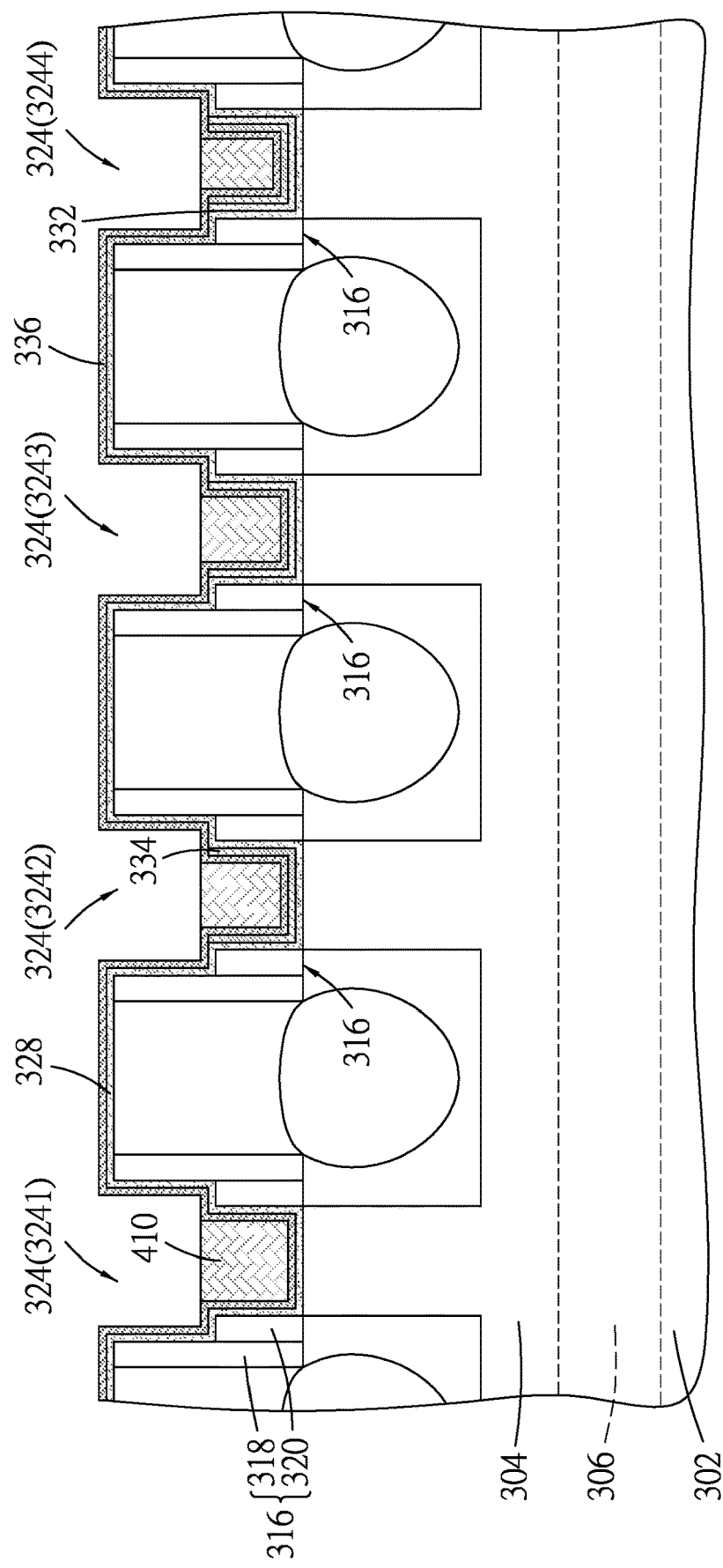
Figure 45:
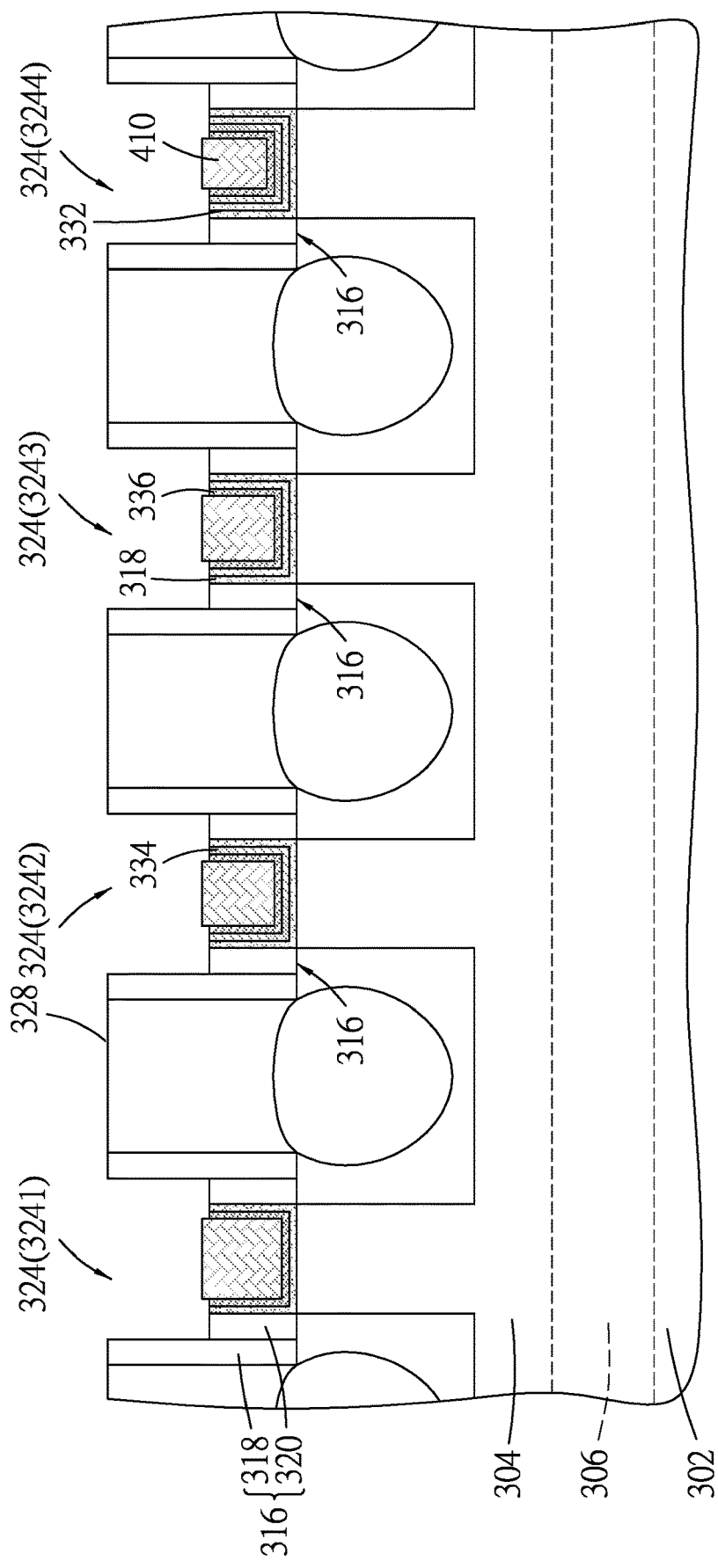
Figure 46:
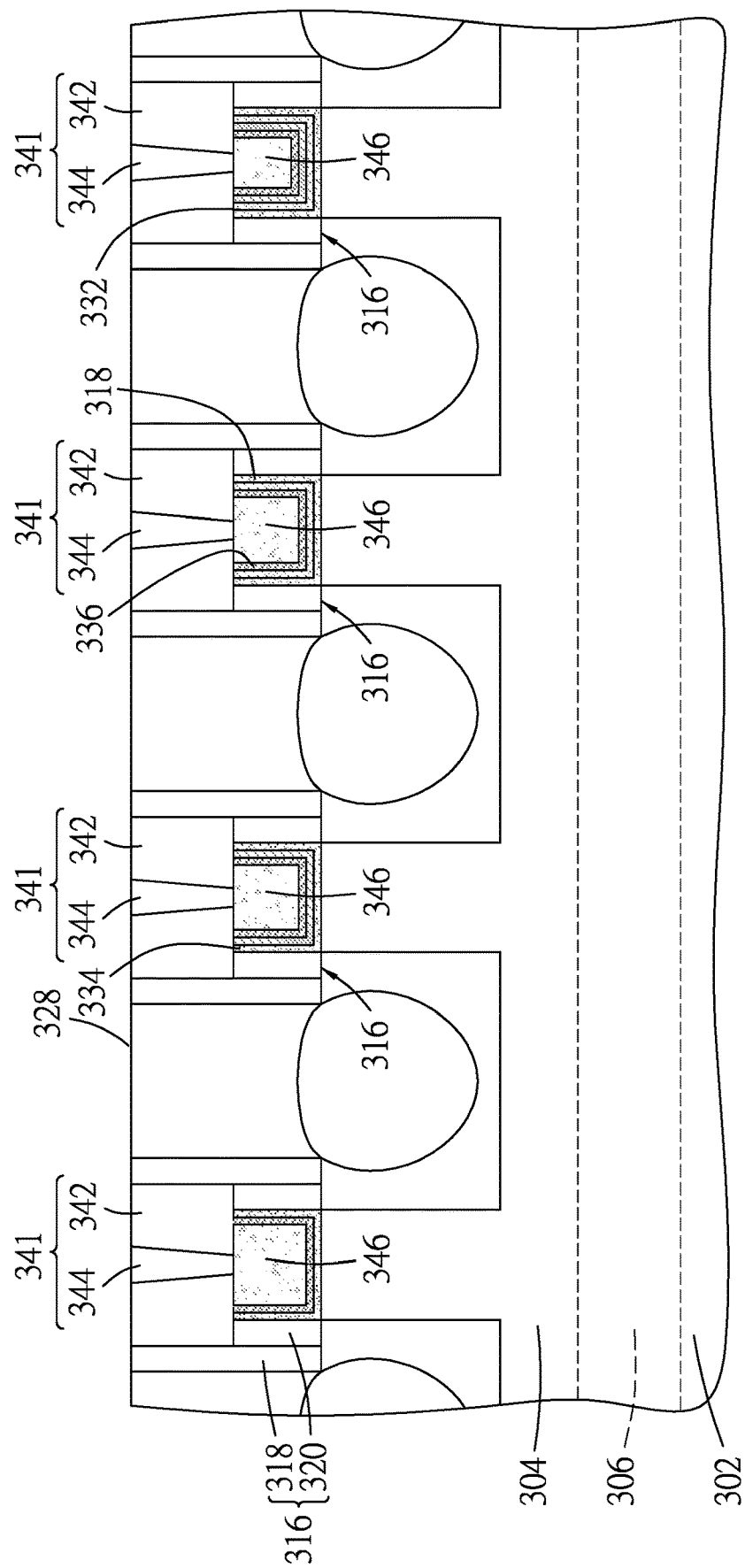

Then, referring to FIG. 36, in some embodiments, the resist layer 408 is formed in the third and fourth gate trenches 3243, 3244 (see FIG. 35), while leaving the first and second gate trenches 3241, 3242 exposed. Then, referring to FIG. 37, in some embodiments, portions of the first work function layer 332 not covered by the resist layer 408 are removed, including portions of the first work function layer 332 in the first and second gate trenches 3241, 3242 and over the spacers 316. Then, referring to FIG. 38, in some embodiments, the resist layer 408 is removed, followed by forming the second work function layer 334, which is formed in the first to fourth gate trenches 3241 to 3244 and over the spacers 316. Then, referring to FIG. 39, in some embodiments, the resist layer 408 is formed in the second and fourth gate trenches 3242, 3244 (see FIG. 38), while leaving the first and third gate trenches 3241, 3243 exposed. Then, referring to FIG. 40, in some embodiments, portions of the second work function layer 334 not covered by the resist layer 408 are removed, including portions of the second work function layer 334 in the first and third gate trenches 3241, 3243 and over the spacers 316. Then, referring to FIG. 41, in some embodiments, the resist layer 408 is formed in lower portions of the second to fourth gate trenches 3242 to 3244, while leaving the first gate trench 3241 and upper portions of the second to fourth gate trenches 3242 to 3244 exposed. Then, referring to FIG. 42, in some embodiments, portions of the first and second work function layers 332, 334 exposed from the resist layer 408 are removed by the above mentioned wet chemical etchants by using the resist layer 408 as an etch mask. Then, referring to FIG. 43, in some embodiments, the work function feature 336 may be formed in the first to fourth gate trenches 3241 to 3244 and over the spacers 316. Then, referring to FIG. 44, in some embodiments, the resist layer 410 may be formed in lower portions of the first to fourth gate trenches 3241 to 3244, while leaving upper portions of the first to fourth gate trenches 3241 to 3244 exposed. Then, referring to FIG. 45, in some embodiments, portions of the work function feature 336 from the first to fourth gate trenches 3241 to 3244 exposed from the resist layer 410 are removed. FIG. 45 also illustrates that portions of the gate dielectric layer 328 are removed. Then, referring to FIG. 46, in some embodiments, the above mentioned conductive gates 346 are respectively formed in the first to fourth gate trenches 3241 to 3244 (see FIG. 45), followed by forming the contact structures 341, each of which includes the contact 344 that is formed in the dielectric layer 342 and that is electrically connected to a respective one of the conductive gates 346, thereby depositing different combinations of work function materials in the first to fourth gate trenches 3241 to 3244 (see FIG. 45).

The embodiments of the present disclosure have some advantageous features. The resist layers can be used for determining the height of the work function materials during the etching process. A wet chemical etching technique is used for etching the work function materials. During the selective wet chemical etching, the structure around the work function materials (e.g., the gate dielectric layer) is not substantially etched, and the dimension of the gate trench is not adversely widened.

In accordance with some embodiments of the present disclosure, a method of forming a semiconductor device is provided. The method includes: forming a semiconductor structure having source/drain regions, a fin disposed between the source/drain regions, and a dummy gate disposed on the fin and surrounded by a spacer; removing the dummy gate to form a gate trench which is defined by a trench-defining wall; forming a gate dielectric layer on the trench-defining wall; forming a work function structure on the gate dielectric layer; forming a resist layer to fill the gate trench; removing a top portion of the resist layer; removing the work function structure exposed from the resist layer using a wet chemical etchant; removing the resist layer; and forming a conductive gate in the gate trench.

In accordance with some embodiments of the present disclosure, in the step of forming the work function structure, the work function structure includes a first work function layer and a second work function layer. In the step of removing the work function structure, the work function structure is etched in such a manner that top surfaces of the first and second work function layers are substantially level with each other.

In accordance with some embodiments of the present disclosure, in the step of forming the work function structure, each of the first and second work function layers is made of p-type work function material or n-type work function material.

In accordance with some embodiments of the present disclosure, in the step of forming the work function structure, the first and second work function layers are made of different p-type work function metals.

In accordance with some embodiments of the present disclosure, in the step of removing the work function structure, the wet chemical etchant includes a mixture of an acid and an oxidizer.

In accordance with some embodiments of the present disclosure, a volume percentage of the acid based on the wet chemical etchant ranges from about 0.01% to about 1%.

In accordance with some embodiments of the present disclosure, the acid of the wet chemical etchant is hydrochloric acid.

In accordance with some embodiments of the present disclosure, in the step of removing the dummy gate, an upper portion of the spacer is removed, such that a width of an upper portion of the gate trench is greater than a width of a lower portion of the gate trench.

In accordance with some embodiments of the present disclosure, in the step of forming the resist layer, the resist layer is made of a nitrogen-based material, a carbon-based material, or a polymer-based material.

In accordance with some embodiments of the present disclosure, in the step of forming the work function structure, the first and second work function layers are respectively made of tungsten nitride and titanium nitride.

In accordance with some embodiments of the present disclosure, a method includes: conformally forming a gate dielectric layer in a gate trench that is disposed on a fin of a semiconductor structure; conformally forming a first work function layer in the gate trench on the gate dielectric layer; conformally forming a second work function layer in the gate trench on the first work function layer; forming a resist layer filling the gate trench; removing a top portion of the resist layer to lower the resist layer in the gate trench to a height; selectively etching the first and second work function layers using a wet chemical etchant with the resist layer as a mask, such that the first and second work function layers are lowered to be no higher than the height with top surfaces of the first and second work function layers substantially level with each other, and the gate dielectric layer is substantially unetched; removing the resist layer; and forming a conductive gate in the gate trench, the conductive gate being electrically connected to the first and second work function layers.

In accordance with some embodiments of the present disclosure, in the steps of forming the first and second work function layers, the first and second work function layers are made of different p-type work function metals.

In accordance with some embodiments of the present disclosure, in the step of electively etching the first and second work function layers, the wet chemical etchant includes an acid and an oxidizer with a volume percentage of the acid based on the wet chemical etchant ranging from about 0.01% to about 1%.

In accordance with some embodiments of the present disclosure, in the step of forming the resist layer, the resist layer is made of a nitrogen-based material, a carbon-based material, or a polymer-based material.

In accordance with some embodiments of the present disclosure, before the step of conformally forming a gate dielectric layer, an upper portion of a spacer surrounding the gate trench is removed, such that a width of an upper portion of the gate trench is greater than a width of a lower portion of the gate trench.

In accordance with some embodiments of the present disclosure, a method of forming a semiconductor device is provided. The method includes: forming a semiconductor structure having a plurality of fins and a plurality of dummy gates separately disposed on the fins; removing the dummy gates to form a plurality of gate trenches respectively exposing the fins; forming a gate dielectric layer in the gate trenches; forming a first work function layer in the gate trenches; removing the first work function layer in at least one of the gate trenches; forming a second work function layer in the gate trenches; removing the second work function layer in at least one of the gate trenches; forming a plurality of resist layers to fill corresponding ones of the gate trenches; removing a top portion of at least one of the resist layers; etching the first work function layer, the second work function layer, or a combination thereof, which is in a corresponding one of the gate trenches and which is exposed from the at least one of the resist layer, using a wet chemical etchant; removing the resist layers; and forming a plurality of conductive gates that are respectively disposed in the gate trenches.

In accordance with some embodiments of the present disclosure, in the step of etching the combination of the first and second work function layers, the combination of the first and second work function layers is etched in such a manner that top surfaces of the first and second work function layers are substantially level with each other.

In accordance with some embodiments of the present disclosure, in the step of etching the first work function layer, the second work function layer, or the combination thereof, the wet chemical etchant includes a mixture of an acid and an oxidizer with a volume percentage of the acid based on the wet chemical etchant ranging from about 0.01% to about 1%.

In accordance with some embodiments of the present disclosure, in the step of forming the resist layer, the resist layer is made of a nitrogen-based material, a carbon-based material, or a polymer-based material.

In accordance with some embodiments of the present disclosure, in the step of forming the first work function layer, the first work function layer is formed in first to fourth ones of the gate trenches. In the step of removing the first work function layer, the first work function layer in the first and second ones of the gate trenches is removed. In the step of forming the second work function layer, the second work function layer is formed in the first to fourth ones of the gate trenches. In the step of removing the second work function layer, the second work function layer in the first and third ones of the gate trenches is removed.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a semiconductor structure having source/drain regions, a fin disposed between the source/drain regions, and a dummy gate disposed on the fin and surrounded by a spacer;
   removing the dummy gate to form a gate trench which is defined by a trench-defining wall;
   forming a gate dielectric layer on the trench-defining wall;
   forming a work function structure on the gate dielectric layer;
   forming a resist layer to fill the gate trench;
   removing a top portion of the resist layer to leave a bottom portion of the resist layer, such that after removing the top portion of the resist layer, a topmost surface of the gate dielectric layer is at a level higher than a level of a topmost surface of the bottom portion of the resist layer;
   removing the work function structure exposed from the resist layer using a wet chemical etchant, while the topmost surface of the gate dielectric layer is kept at the level higher than the level of the topmost surface of the bottom portion of the resist layer;
   removing the bottom portion of the resist layer; and
   forming a conductive gate in the gate trench.

2. The method as claimed in claim 1, wherein:
   in forming the work function structure, the work function structure includes a first work function layer and a second work function layer; and
   in removing the work function structure, the work function structure is etched in such a manner that top surfaces of the first work function layer and the second work function layer are substantially level with each other.

3. The method as claimed in claim 2, wherein, in forming the work function structure, each of the first work function layer and the second work function layer is made of p-type work function material or n-type work function material.

4. The method as claimed in claim 2, wherein, in forming the work function structure, the first work function layer and the second work function layer are made of different p-type work function metals.

5. The method as claimed in claim 2, wherein, in forming the work function structure, the first work function layer and the second work function layer are respectively made of tungsten nitride and titanium nitride.

6. The method as claimed in claim 1, wherein, in removing the work function structure, the wet chemical etchant includes a mixture of an acid and an oxidizer.

7. The method as claimed in claim 6, wherein a volume percentage of the acid based on the wet chemical etchant ranges from about 0.01% to about 1%.

8. The method as claimed in claim 6, wherein the acid of the wet chemical etchant is hydrochloric acid.

9. The method as claimed in claim 1, wherein, in removing the dummy gate, an upper portion of the spacer is removed, such that a width of an upper portion of the gate trench is greater than a width of a lower portion of the gate trench.

10. The method as claimed in claim 1, wherein, in forming the resist layer, the resist layer is made of a nitrogen-based material, a carbon-based material, or a polymer-based material.

11. A method of forming a semiconductor device, comprising:
conformally forming a gate dielectric layer in a gate trench that is disposed on a fin of a semiconductor structure;
conformally forming a first work function layer in the gate trench on the gate dielectric layer;
conformally forming a second work function layer in the gate trench on the first work function layer;
forming a resist layer filling the gate trench;
removing a top portion of the resist layer to leave a bottom portion of the resist layer with a height, such that after removing the top portion of the resist layer, a topmost surface of the gate dielectric layer is at a level higher than a level of a topmost surface of the bottom portion of the resist layer;
selectively etching the first work function layer and the second work function layer using a wet chemical etchant with the bottom portion of the resist layer as a mask, such that the first work function layer and the second work function layer are lowered to be no higher than the height with top surfaces of the first work function layer and the second work function layer substantially level with each other, and the gate dielectric layer is substantially unetched, the topmost surface of the gate dielectric layer being kept at the level higher than the level of the topmost surface of the bottom portion of the resist layer;
removing the resist layer; and
forming a conductive gate in the gate trench, the conductive gate being electrically connected to the first work function layer and the second work function layer.

12. The method as claimed in claim 11, wherein, in forming the first work function layer and the second work function layer, the first work function layer and the second work function layer are made of different p-type work function metals.

13. The method as claimed in claim 12, wherein, in selectively etching the first work function layer and the second work function layer, the wet chemical etchant includes an acid and an oxidizer with a volume percentage of the acid based on the wet chemical etchant ranging from about 0.01% to about 1%.

14. The method as claimed in claim 11, wherein, in forming the resist layer, the resist layer is made of a nitrogen-based material, a carbon-based material, or a polymer-based material.

15. The method as claimed in claim 11, wherein, before conformally forming the gate dielectric layer, an upper portion of a spacer surrounding the gate trench is removed, such that a width of an upper portion of the gate trench is greater than a width of a lower portion of the gate trench.

16. A method of forming a semiconductor device, comprising:
forming a semiconductor structure having fins and dummy gates separately disposed on the fins;
removing the dummy gates to form gate trenches respectively exposing the fins;
forming a gate dielectric layer in the gate trenches;
forming a first work function layer in the gate trenches;
removing the first work function layer in at least one of the gate trenches;
forming a second work function layer in the gate trenches;
removing the second work function layer in at least one of the gate trenches;
forming resist layers to fill corresponding ones of the gate trenches;
removing a top portion of at least one of the resist layers to leave a bottom portion of the at least one of the resist layers, such that after removing the top portion of the at least one of the resist layers, a topmost surface of the gate dielectric layer is at a level higher than a level of a topmost surface of the bottom portion of the at least one of the resist layers;
etching the first work function layer, the second work function layer, or a combination thereof, which is in a corresponding one of the gate trenches and which is exposed from the bottom portion of the at least one of the resist layers, using a wet chemical etchant;
removing the resist layers; and
forming conductive gates that are respectively disposed in the gate trenches.

17. The method as claimed in claim 16, wherein, in etching the combination of the first work function layer and the second work function layer, the combination of the first work function layer and the second work function work function layer is etched in such a manner that top surfaces of the first work function layer and the second work function layer are substantially level with each other.

18. The method as claimed in claim 17, wherein, in etching the first work function layer, the second work function layer, or the combination thereof, the wet chemical etchant includes a mixture of an acid and an oxidizer with a volume percentage of the acid based on the wet chemical etchant ranging from about 0.01% to about 1%.

19. The method as claimed in claim 16, wherein, in forming the resist layers, the resist layers are made of a nitrogen-based material, a carbon-based material, or a polymer-based material.

20. The method as claimed in claim 16, wherein:
in forming the first work function layer, the first work function layer is formed in first to fourth ones of the gate trenches;
in removing the first work function layer, the first work function layer in the first and second ones of the gate trenches is removed;

in forming the second work function layer, the second work function layer is formed in the first to fourth ones of the gate trenches; and in removing the second work function layer, the second work function layer in the first and third ones of the gate trenches is removed.

\* \* \* \* \*